United States Patent
Kobayashi

(10) Patent No.: US 8,214,982 B2
(45) Date of Patent: Jul. 10, 2012

(54) METHOD OF FABRICATING PIEZOELECTRIC VIBRATING PIECES

(75) Inventor: Takashi Kobayashi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 758 days.

(21) Appl. No.: 12/360,435

(22) Filed: Jan. 27, 2009

(65) Prior Publication Data

US 2009/0205179 A1 Aug. 20, 2009

(30) Foreign Application Priority Data

Feb. 14, 2008 (JP) ................................. 2008-033068

(51) Int. Cl.
 *H04R 17/10* (2006.01)
 *H01L 41/047* (2006.01)
(52) U.S. Cl. ........ 29/25.35; 29/842; 29/846; 29/896.22; 310/366; 310/370; 73/504.16
(58) Field of Classification Search ......... 29/25.35, 29/594, 842, 846, 896.22; 310/365, 366, 310/370, 324; 73/504.16
 See application file for complete search history.

(56) References Cited

U.S. PATENT DOCUMENTS

| 4,173,726 A | * | 11/1979 | Hanji | 310/366 |
| 6,523,410 B2 | * | 2/2003 | Matsubara et al. | 73/504.16 |
| 2004/0174092 A1 | * | 9/2004 | Iwata | 310/324 |

FOREIGN PATENT DOCUMENTS

| JP | 07-212161 | 8/1995 |
| JP | 11195946 A | * 7/1999 |
| JP | 2009081521 A | * 4/2009 |

* cited by examiner

*Primary Examiner* — A. Dexter Tugbang
(74) *Attorney, Agent, or Firm* — Brinks Hofer Gilson & Lione

(57) ABSTRACT

To carry out frequency adjustment easily, accurately and efficiently without being influenced by a size of a piezoelectric vibrating piece and achieve low cost formation and promotion of maintenance performance, there is provided a method of fabricating a piezoelectric vibrating piece which is a method of fabricating a piezoelectric vibrating piece having a piezoelectric vibrating plate 11, a pair of exciting electrodes 12, 13, and a pair of mount electrodes 15, 16 by utilizing a wafer S, the method including an outer shape forming step of forming a frame portion S1 at a wafer and forming a plurality of piezoelectric plates at the frame portion to be connected thereto by way of a connecting portion 11a, an electrode forming step of forming pairs of exciting electrodes and pairs of mount electrodes respectively at the plurality of piezoelectric plates and forming a common electrode S2 respectively electrically connected to a plurality of the pairs of mount electrodes 15 on one side by way of the connecting portion, a frequency adjusting step of adjusting a frequency of the piezoelectric plate by applying a drive voltage between the common electrode and the mount electrode 16 on other side, and a cutting step of fragmenting the plurality of piezoelectric plates.

3 Claims, 16 Drawing Sheets

METHOD OF FABRICATING PIEZOELECTRIC VIBRATING PIECES

RELATED APPLICATIONS

This application claims priority under 35 U.S.C. §119 to Japanese Patent Application No. JP2008-033068 filed on Feb. 14, 2008, the entire content of which is hereby incorporated by reference.

BACKGROUND OF THE INVENTION

1. Field of the Invention

The present invention relates to a method of fabricating a piezoelectric vibrating piece, a piezoelectric vibrating piece fabricated by the fabricating method, a wafer used for fabricating the piezoelectric vibrating piece, a piezoelectric vibrator having the piezoelectric vibrating piece, an oscillator, an electronic apparatus and a radiowave timepiece having the piezoelectric vibrator.

2. Description of the Related Art

In recent years, a portable telephone or a portable information terminal apparatus uses a piezoelectric vibrator utilizing quartz or the like as a time source, a timing source of a control signal or the like or a reference signal source or the like. As a piezoelectric vibrator of this kind, various ones are known, and, for example, a piezoelectric vibrator having a piezoelectric vibrating piece of a tuning fork type, a piezoelectric vibrator having a piezoelectric vibrating piece of carrying out a thickness slipping vibration and the like are known.

Explaining by taking an example of a piezoelectric vibrating piece of a tuning fork type, as shown by FIG. 20 and FIG. 21, a piezoelectric vibrating piece 201 includes a piezoelectric plate 212 having a pair of vibrating arm portion 210 arranged in parallel and a base portion 211 integrally fixing base end sides of the pair of vibrating arm portions 210, a pair of exciting electrodes 213 formed at outer surfaces of the pair of vibrating arm portions 210 for vibrating the pair of vibrating arm portions 210, and mount electrodes 214 respectively electrically connected to the pair of exciting electrodes 213. According to the piezoelectric vibrating piece 201, the pair of vibrating arm portions 210 are vibrated in directions of being proximate to or remote from each other when a predetermined drive voltage is applied to the pair of exciting electrodes 213 by way of the pair of mount electrodes 214. Further, at this occasion, a weight of a weight metal film 215 coated at a front end of the vibrating arm portion 210 is previously adjusted (frequency adjustment) to vibrate the pair of vibrating arm portions 210 by a predetermined frequency.

It is general to fabricate a plurality of the piezoelectric vibrating pieces 201 of this kind at a time utilizing a wafer made of various piezoelectric materials of quartz, lithium tantalate, lithium niobate or the like (for example, JP-A-7-212161).

Specifically, as shown by FIG. 22, a raw stone of a piezoelectric material is cut to constitute a wafer S, thereafter, the wafer S is polished to a predetermined thickness. Further, after cleaning, drying the polished wafer S, an outer shape of the piezoelectric plate 212 is formed by etching by a photolithography technology, and a predetermined metal film is patterned to thereby form the respective electrodes and the weight metal film 215. Thereafter, by cutting the respective piezoelectric plates 212 from the wafer S to fragment, a plurality of the piezoelectric vibrating pieces 201 can be fabricated at a time from the single wafer S.

Meanwhile, in a procedure of the fabrication, normally, a frequency adjustment (rough adjustment) of the piezoelectric plate 212 is carried out before fragmentation. Specifically explaining, first, the pair of vibrating arm portions 210 are oscillated by applying a drive voltage by contacting terminals of a frequency adjustor (for example, oscillating circuit, network analyzer or the like) respectively to the pair of mount electrodes 214. Further, the weight of the weight metal film 215 is adjusted by a trimming apparatus (for example, laser or the like) of the frequency adjustor while measuring a frequency at that occasion by the frequency adjustor. Thereby, the frequency adjustment can be carried out.

However, in the method of fabricating the piezoelectric vibrating piece, the following problem remains.

First, in order to carry out a frequency adjustment of the piezoelectric plate, it is necessary to contact the terminals of the frequency adjustor to both of the pair of mount electrodes. That is, it is necessary to contact the two terminals to the one piezoelectric plate. However, the pair of mount electrodes are formed in a state of being aligned in parallel on the outer surface of the piezoelectric plate of a size of a width of about several hundreds µm. Therefore, in order to accurately carry out the contact, it is necessary to position the terminals of the pair of mount electrodes after making the two terminals as proximate thereto as possible. Therefore, a control of the terminal is difficult and the control is obliged to carry out with care. Therefore, time is taken in the frequency adjustment and an efficient operation cannot be carried out.

Further, in recent years, the size of the piezoelectric vibrating piece is downsized, and also an interval between the pair of mount electrodes is narrowed.

Further, in order to carry out the frequency adjustment as efficiently as possible, in the background art, there is also carried out a method of simultaneously contacting two terminals to a plurality of piezoelectric plates to carry out frequency measurement simultaneously by the plurality of piezoelectric plates without adjusting the piezoelectric plates one by one. For example, there is provided a method of dividing a plurality of piezoelectric plates connected to the wafer by a unit of a row, and carrying out frequency measurement of the respective rows. Although thereby, an operational efficiency can be increased, on the contrary, it is necessary to increase a number of terminals of a frequency adjustor twice as much as a number of piezoelectric plates simultaneously vibrated. Therefore, it is necessary to prepare a number of terminals beforehand and it is difficult to achieve a reduction in cost. Further, the control of the terminal is difficult even in accurately contacting the two terminals to the one piezoelectric plate as described above. In contrast thereto, when the frequency adjustment is simultaneously carried out, it is necessary to simultaneously and accurately contact a number of terminals to mount electrodes of a plurality of piezoelectric plates, and therefore, a further difficult operation is constituted.

In addition thereto, when small-sized formation of the size of the piezoelectric vibrating piece is aimed at as described above, the interval between the piezoelectric plates contiguous to each other is further narrowed. Therefore, there is brought about a situation in which the contact of respective twos of terminals to a plurality of piezoelectric plates per se is severe.

Further, as the terminals of the frequency adjustor increases, a number of steps consumed for maintenance of the terminals is needed. Therefore, although the frequency adjusting operation can efficiently be carried out by simultaneously carrying out the frequency measurement of the plurality of piezoelectric plates, on the contrary, a deterioration in maintenance performance is brought about.

SUMMARY OF THE INVENTION

The invention has been carried out in view of the above-described situation and it is an object thereof to provide a method of fabricating a piezoelectric vibrating piece capable of easily, accurately and efficiently carrying out a frequency adjustment without being influenced by a size of the piezoelectric vibrating piece and capable of achieving low cost formation and promotion of maintenance performance, a piezoelectric vibrating piece fabricated by the fabricating method and a wafer used for fabricating the piezoelectric vibrating piece.

Further, it is an object thereof to provide a piezoelectric vibrator having the piezoelectric vibrating piece, an oscillator, an electronic apparatus and a radiowave timepiece having the piezoelectric vibrator.

The invention provides the following means in order to resolve the problem.

A method of fabricating a piezoelectric vibrating piece according to the invention is a method of fabricating a plurality of piezoelectric vibrating pieces each having a piezoelectric plate, a pair of exciting electrodes formed on an outer surface of the piezoelectric plate for vibrating the piezoelectric plate when a predetermined drive voltage is applied thereto, and a pair of mount electrodes formed on a base end side of the piezoelectric plate and respectively electrically connected to the pair of exciting electrodes at a time utilizing a wafer made of a piezoelectric material, the method comprising an outer shape forming step of forming a frame portion and forming the plurality of piezoelectric plates to the frame portion in a cantilever shape by way of a connecting portion in a state of directing base end sides of the piezoelectric plates to the frame portion by etching the wafer by a photolithography technology, an electrode forming step of respectively forming the pairs of exciting electrodes and the pairs of mount electrodes to the plurality of piezoelectric plates and forming a common electrode respectively electrically connected to the plurality of mount electrodes on one side by way of the connecting portion on the frame portion by patterning an electrode film to the wafer, a frequency adjusting step of adjusting a frequency of the piezoelectric plate while vibrating the piezoelectric plate by applying a drive voltage between the common electrode and the mount electrode on other side, and a cutting step of fragmenting the plurality of piezoelectric plates by cutting the connecting portion.

Further, a piezoelectric vibrating piece according to the invention is a piezoelectric vibrating piece fabricated by cutting a connecting portion from a state of being connected to a wafer in a cantilever shape by way of the connecting portion, the piezoelectric vibrating piece including a piezoelectric plate a base end side of which is connected to the connecting portion, a pair of exciting electrodes formed on an outer surface of the piezoelectric plate for vibrating the piezoelectric plate when a predetermined drive voltage is applied thereto, and a pair of mount electrodes formed on a base end side of the piezoelectric plate and respectively electrically connected to the pair of exciting electrodes, wherein the mount electrode on one side of the pair of mount electrodes is formed to be brought into contact with an edge end of the base end side of the piezoelectric plate and extended to the connecting portion by a time point before being cut.

In the method of fabricating the piezoelectric vibrating piece and the piezoelectric vibrating piece according to the invention, first, there is carried out the outer shape forming step of forming the frame portion and forming the plurality of piezoelectric plates to be connected to the frame portion by etching the wafer made of the piezoelectric material of quartz or the like by the photolithography technology. At this occasion, etching is carried out such that the plurality of piezoelectric plates are connected in the cantilever shape by way of the connecting portion in the state of directing the base end sides to the frame portion.

Next, there is carried out the electrode forming step of respectively forming the pairs of vibrating electrodes and the pairs of mount electrodes to the plurality of piezoelectric plates and forming the common electrode on the frame portion by patterning the electrode film to the wafer. At this occasion, the common electrode is formed to be respectively electrically connected to the plurality of mount electrodes on one side by way of the connecting portion. Thereby, all of the mount electrodes on one side respectively formed on the plurality of piezoelectric plates connected to the frame portion are brought into a state of being conducted to the common electrode.

Next, there is carried out the frequency adjusting step of adjusting the frequency of the piezoelectric plate while vibrating the piezoelectric plate. Successively, there is carried out the cutting step of cutting to separate the plurality of piezoelectric plates and the frame portion to respectively fragment by cutting the connecting portion. Thereby, the plurality of piezoelectric vibrating plates formed with the pairs of exciting electrodes and the pairs of mount electrodes on the outer surfaces of the piezoelectric plates can be fabricated from the single wafer at a time. Further, the connecting portion is cut by the cutting step, and therefore, also the mount electrode on one side connected to the common electrode by way of the connecting portion is simultaneously cut to separate. Therefore, the mount electrode on one side is constituted by the shape of being formed to be brought into contact with an edge side on the base end side of the piezoelectric plate.

Particularly, the mount electrode on one side is connected to the common electrode formed on the frame portion, and therefore, in carrying out the frequency adjusting step, different from the background art, the piezoelectric plate can be vibrated by applying the drive voltage by contacting the terminals of the frequency adjustor respectively to the common electrode and the mount electrode on other side. In the case of the background art, it is necessary to contact the terminals to both of the pair of mount electrodes. That is, it is necessary to contact the two terminals to the one piezoelectric plate. Therefore, in order to accurately carry out the contact, it is necessary to accurately position to the terminals to the pair of mount electrodes in a state of making the two terminals as proximate as possible.

In contrast thereto, when the common electrode is utilized, the terminal on one side may be contacted to the common electrode formed at the frame portion and the terminal on other side may be contacted to the mount electrode on other side, and therefore, it is necessary to make the two terminals proximate to each other. That is, the one terminal may be contacted to the one piezoelectric plate. Therefore, a control of the terminal can easily be carried out, and the frequency adjustment can be carried out further speedly and accurately. Further, an efficient operation can be carried out.

Further, even when an interval of the pair of mount electrodes is narrowed, assumedly, by achieving small-sized formation, it is not necessary to make the two terminals proximate to each other, and therefore, the above-described effect can successively be achieved. Therefore, the frequency adjustment can firmly be carried out without being influenced by the size of the piezoelectric vibrating piece.

Further, in the method of fabricating the piezoelectric vibrating piece according to the invention, the frequency of the piezoelectric plates is adjusted while vibrating the plurality of piezoelectric plates simultaneously by applying the drive voltage to between the common electrode and the mount electrode on other side in the frequency adjusting step.

In the method of fabricating the piezoelectric vibrating piece according to the invention, in the frequency adjusting step, the frequency of the piezoelectric plate is adjusted while simultaneously vibrating the plurality of piezoelectric plates by applying the drive voltage by contacting the terminals to the mount electrodes on the other side of the plurality of piezoelectric plates without vibrating the piezoelectric plates one by one. Thereby, the frequency adjustment can further efficiently be carried out, and the fabrication efficiency can be promoted.

Meanwhile, when the plurality of piezoelectric plates are simultaneously vibrated in the background art, it is necessary to contact the terminals respectively to the pairs of mount electrodes of the respective piezoelectric plates, and therefore, a number of the terminals needs to be twice as much as the number of the piezoelectric plates.

In contrast thereto, the common electrode is utilized, and therefore, the terminals may be contacted to the common electrode and the mount electrodes on other side of the respective piezoelectric plates. Therefore, a number of the terminals is not the number twice as much as the number of the piezoelectric plates to be vibrated but may be the number of adding the number of the piezoelectric plates to be vibrated and the one for the common electrode. Therefore, the number of the terminals can considerably be reduced in comparison with that of the background art, and a reduction in cost can be achieved. Further, the number of the terminals can considerably be reduced, further, the one terminal may be contacted to the one piezoelectric plate, and therefore, the control of the terminal becomes easy invariably. Therefore, even when the frequency adjustment is carried out simultaneously for the plurality of the piezoelectric plates, the frequency adjustment can easily and accurately be carried out.

Further, even when the interval of the piezoelectric plates contiguous to each other is narrowed, assumedly, by achieving further small-sized formation, only the one terminal may be contacted to the one piezoelectric plate, and therefore, the contact can be carried out easily. Therefore, the frequency adjustment can firmly be carried out without being influenced by the size of the piezoelectric vibrating piece.

In addition thereto, the number of the terminals can considerably be reduced, and therefore, the number of steps consumed in maintenance of the terminal can be reduced. Thereby, promotion of maintenance performance can be achieved.

Further, a wafer according to the invention is a wafer to which a plurality of piezoelectric vibrating pieces each including a piezoelectric plate, a pair of exciting electrodes formed on an outer surface of the piezoelectric plate for vibrating the piezoelectric plate when a predetermined drive voltage is applied thereto, and a pair of mount electrodes formed on a base end side of the piezoelectric plate and respectively electrically connected to the pair of exciting electrodes are connected, the wafer comprising a frame portion connected with the piezoelectric plate of the piezoelectric vibrating piece in a cantilever shape by way of a connecting portion in a state of directing the base end side, and a common electrode formed to be respectively electrically connected to the mount electrodes of the plurality of piezoelectric vibrating pieces on one side by way of the connecting portion.

In the wafer according to the invention, the frequency of the piezoelectric plate can be adjusted while vibrating the piezoelectric plate by applying the drive voltage between the common electrode and the mount electrode on other side. At this occasion, by utilizing the common electrode, the frequency adjustment can easily and accurately and efficiently be carried out without being influenced by the size of the piezoelectric vibrating piece. Further, when the frequency of the plurality of piezoelectric plates are simultaneously adjusted, low cost formation and promotion of maintenance can be achieved in comparison with the background art.

Further, the plurality of piezoelectric vibrating pieces can be fabricated at a time by fragmenting the plurality of piezoelectric plates by cutting the connecting portion of the wafer in which the frequency of the piezoelectric plate is adjusted by the above-described method. According to the piezoelectric vibrating piece, high quality formation and low cost formation can be achieved.

Further, there is provided a piezoelectric vibrator according to the invention, wherein the piezoelectric vibrator includes a piezoelectric vibrating piece of the invention.

In the piezoelectric vibrator according to the invention, the above-described piezoelectric vibrating piece is provided, and therefore, the predetermined frequency can be ensured, and high quality formation and low cost formation of the piezoelectric vibrator can be achieved.

Further, in an oscillator according to the invention, the piezoelectric vibrator of the invention is electrically connected to an integrated circuit as an oscillating piece.

Further, in an electronic apparatus according to the invention, the piezoelectric vibrator of the invention is electrically connected to a time counting portion.

Further, in a radiowave timepiece according to the invention, the piezoelectric vibrator of the invention is electrically connected to a filter portion.

In the oscillator, the electronic apparatus and the radiowave timepiece according to the invention, the above-described piezoelectric vibrator is provided, and therefore, high quality formation and low cost formation can be achieved similar to the piezoelectric vibrator.

According to the method of fabricating the piezoelectric vibrating piece of the invention, the frequency adjustment can easily and accurately and efficiently be carried out without being influenced by the size of the piezoelectric vibrating piece, and low cost formation and promotion of maintenance performance can be achieved.

Further, according to the piezoelectric vibrating piece of the invention, the piezoelectric vibrating piece is fabricated by the method of fabricating the piezoelectric vibrating piece, the frequency adjustment can easily, accurately and efficiently be carried out, and therefore, high quality formation and low cost formation can be achieved.

Further, according to the wafer of the invention, the piezoelectric vibrating pieces can be fabricated at a time and efficiently, and low cost formation can be achieved.

Further, according the piezoelectric vibrator, the oscillator, the electronic apparatus and the radiowave timepiece, the piezoelectric vibrating piece is provided, and therefore, high quality formation and low cost formation can be achieved.

DETAILED DESCRIPTION OF THE PREFERRED EMBODIMENTS

An embodiment according to the invention will be explained in reference to FIG. 1 through FIG. 11 as follows. Further, according to the embodiment, an explanation will be given by taking an example of a piezoelectric vibrator of a cylinder package type as a piezoelectric vibrator 1.

Figure 1:
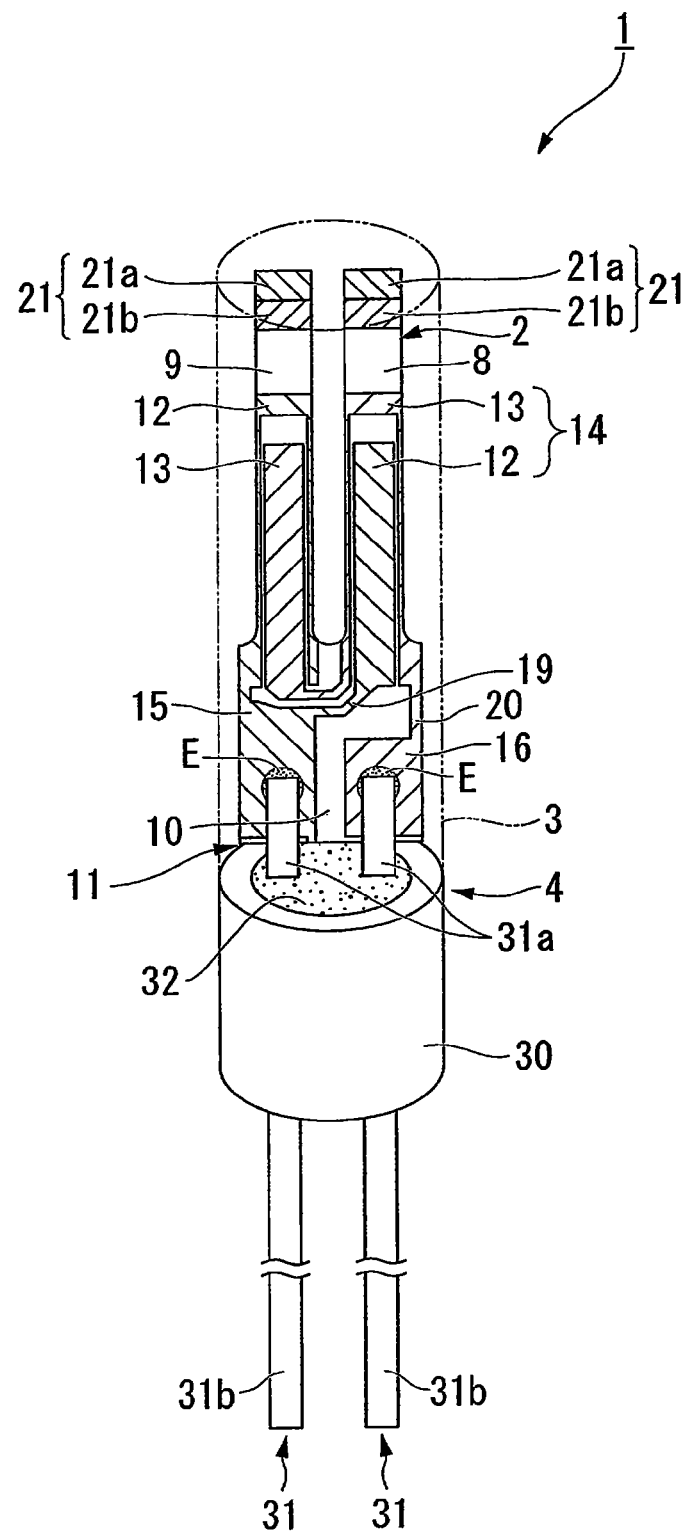
FIG. 1 is a view viewing a content of a case of a piezoelectric vibrator of an embodiment according to the invention and is a view of a state of planely viewing a piezoelectric vibrating piece.
Figure 2:
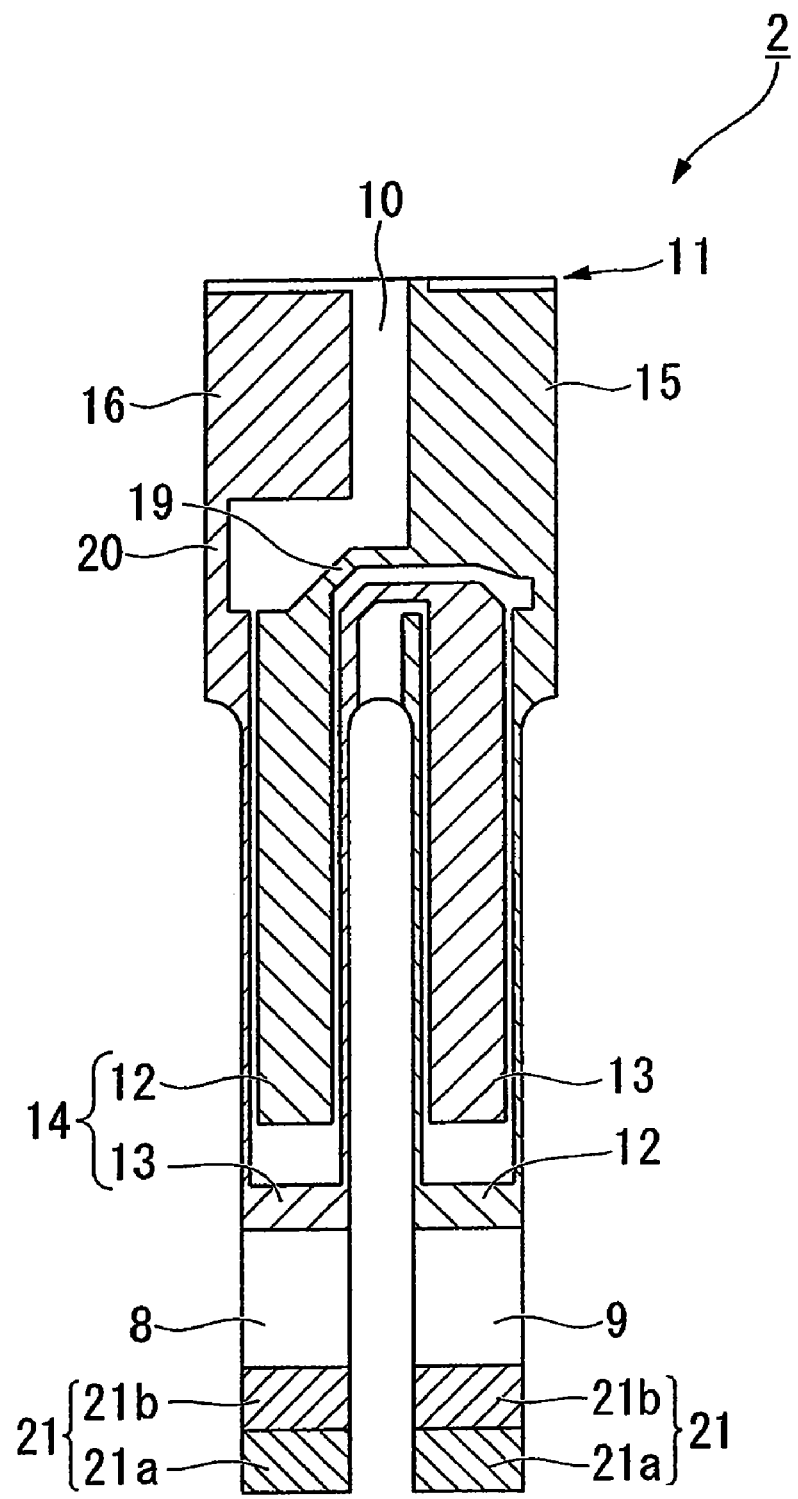
FIG. 2 is a view viewing the piezoelectric vibrating piece shown in FIG. 1 from an upper face.
Figure 3:
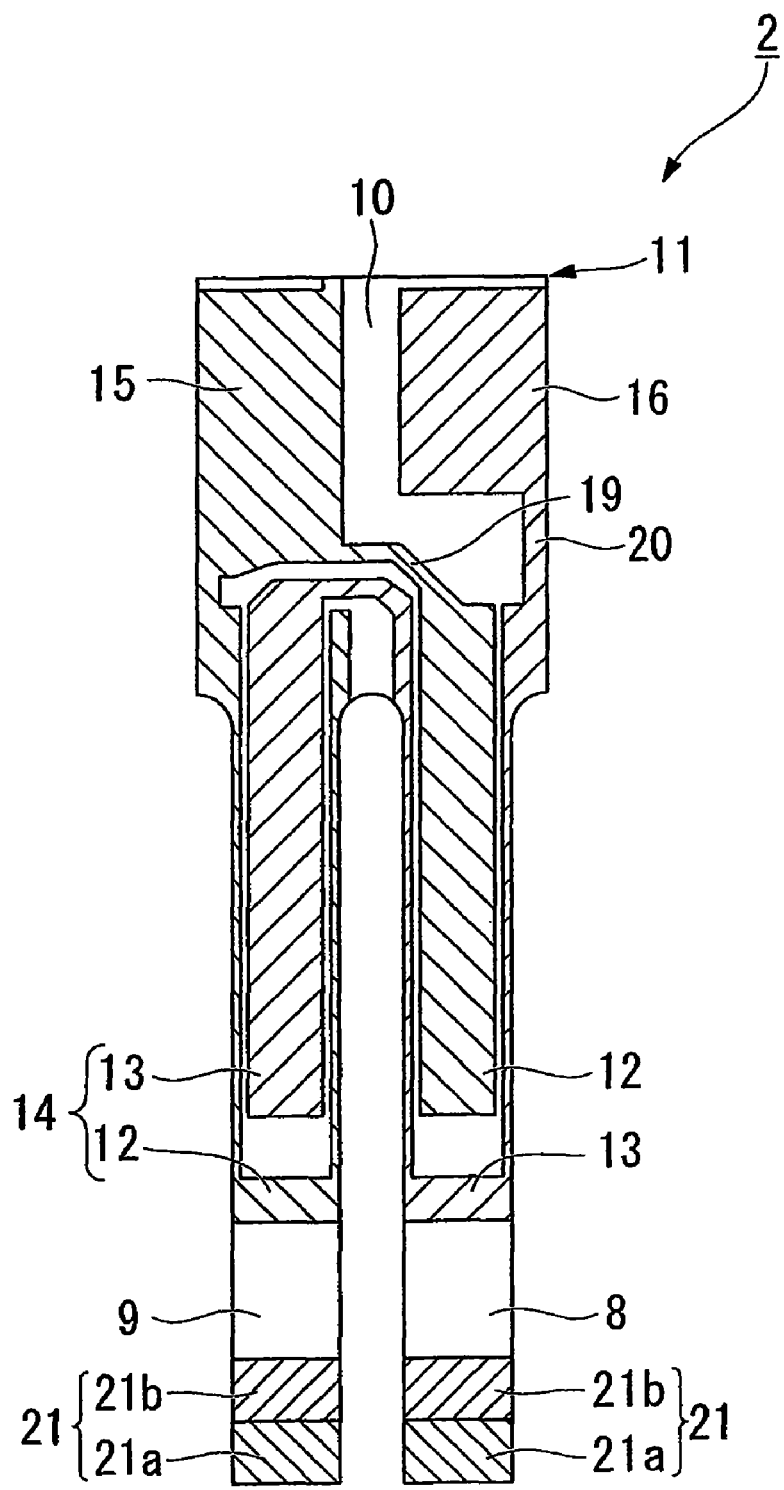
FIG. 3 is a view viewing the piezoelectric vibrating piece shown in FIG. 1 from a lower face.

As shown by FIG. 1 through FIG. 3, the piezoelectric vibrator 1 of the embodiment includes a piezoelectric vibrating piece 2, a case 3 of containing the piezoelectric vibrating piece 2 at inside thereof, and a plug 4 constituting an airtight terminal of hermetically closing the piezoelectric piece 2 at inside of the case 3.

As shown by FIG. 2 and FIG. 3, the piezoelectric vibrating piece 2 is a vibrating piece of a tuning fork type formed by a piezoelectric material of quartz, lithium tantalite, lithium niobate or the like and is vibrated when a predetermined voltage is applied thereto.

The piezoelectric vibrating piece 2 includes a piezoelectric plate 11 having a pair of vibrating arm portions 8, 9 arranged in parallel, a base portion 10 integrally fixing base end sides of the pair of vibrating arm portions 8, 9 and a pair of exciting electrodes 14 including a first exciting electrode 12 and a second exciting electrode 13 formed on outer surfaces of the pair of vibrating arm portions 8, 9 for vibrating the pair of vibrating arm portions 8, 9, and mount electrodes 15, 16 electrically connected to the first exciting electrode 12 and the second exciting electrode 13.

The pair of exciting electrodes 14 including the first exciting electrode 12 and the second exciting electrode 13 are electrodes of vibrating the pair of vibrating arm portions 8, 9 in directions of being proximate to or remote from each other, and are formed by being patterned on outer surfaces of the pair of vibrating arm portions 8, 9 in a state of being respectively electrically cut to separate. Specifically, the first exciting electrode 12 is formed mainly on the vibrating arm portion 8 on one side and on two side faces of the vibrating arm portions 9 on other side, and the second exciting electrode 13 is formed mainly on two side faces of the vibrating arm portions 8 on one side and on the vibrating arm portion 9 on other side.

Further, the first exciting electrode 12 and the second exciting electrode 13 are electrically connected to the mount electrodes 15, 16 respectively by way of leadout electrodes 19, 20 on both main faces of the base portion 13. The mount electrodes 15, 16 are formed on a base end side of the piezoelectric plate 11. Further, the mount electrode 15 on one side is formed to be brought into contact with an edge portion on the base end side of the piezoelectric plate 11.

Further, the voltage is applied to the piezoelectric vibrating piece 2 by way of the mount electrodes 15, 16.

Further, front ends of the pair of vibrating arm portions 8, 9 are coated with weight metal films 21 for adjusting (frequency adjustment) vibrating states of their own to vibrate within a range of a predetermined frequency. Further, the weight metal film 21 is divided into a rough adjusting film 21a used in roughly adjusting the frequency, and a fine adjusting film 21b used in finely adjusting the frequency. By carrying out the frequency adjustment by utilizing the rough adjusting film 21a and the fine adjusting film 21b, the frequency of the pair of vibrating arm portions 8, 9 can be confined within a nominal frequency of a device.

As shown by FIG. 1, the case 3 is formed in a shape of a bottomed circular cylinder, press-fit to be fitted to be fixed to an outer periphery of a stem 30 mentioned later of the plug 4 in a state of containing the piezoelectric vibrating piece 2 at inside thereof. Further, the case 3 is press-fit under a vacuum atmosphere, and a space surrounding the piezoelectric vibrating piece 2 at inside of the case 3 is brought into a state of being maintained in vacuum.

The plug 4 includes the stem 30 for hermetically closing the case 3, 2 pieces of lead terminals 31 one end sides of which are made to constitute inner leads 31a arranged in parallel to penetrate the stem 30 and mounting (mechanically bonding and electrically connecting) the piezoelectric vibrating piece 2 by interposing the stem 30 therebetween, and other end sides of which are made to constitute outer leads 31b electrically connected to outside, and an insulating filling member 32 filled to an inner side of the stem 30 for fixing the stem 30 and the lead terminals 31.

The stem 30 is formed in a ring-like shape by a metal material. Further, a material of the filling member 32 is, for example, borosilicate glass. Further, platings, not illustrated, of the same material are respectively applied to a surface of the lead terminal 31 and an outer periphery of the stem 30.

Portions of 2 pieces of the lead terminals 31 projected to inside of the case 3 are made to constitute the inner leads 31a and portions thereof projected to outside of the case 3 are made to constitute the outer leads 31b. Further, the inner leads 31a and the mount electrodes 15, 16 are mounted by way of conductive bumps E. That is, the inner leads 31a and the mount electrodes 15, 16 are mechanically bonded and at the same time, electrically connected by way of the bumps E. As a result, the piezoelectric vibrating piece 2 is brought into a state of being mounted to 2 pieces of the lead terminals 31.

Further, the above-described 2 pieces of the lead terminals 31 are made to function as external portion connecting terminals one end sides (sides of outer leads 31b) of which are electrically connected to outside and other end sides (sides of inner leads 31a) are mounted to the piezoelectric vibrating piece 2.

Here, an example of dimensions and materials of principal parts constituting the plug 4 will be described.

A diameter of the lead terminal 31 is, for example, about 0.12 mm, as a material of a base member of the lead terminal 31, kovar (FeNiCo alloy) is commonly used. Further, as a material of the platings coated to the outer surface of the lead terminal 31 and the outer periphery of the stem 30, Cu is used as a matrix film, and as a finish film, heat resistant solder plating, (alloy of tin and lead, a weight ratio thereof is 1:9), silver (Ag), tin copper alloy (SnCu), gold tin alloy (AuSn) or the like is used.

Further, by carrying out cold pressure welding in vacuum at an inner periphery of the case 3 while interposing a metal film (plating layer) coated on the outer periphery of the stem 30, inside of the case 3 can be sealed in airtight in a vacuum state.

When the piezoelectric vibrator 1 constituted in this way is operated, a predetermined drive voltage is applied to the outer leads 31b of 2 pieces of the lead terminals 31. Thereby, a current can be made to flow to the pair of exciting electrodes 14 including the first exciting electrode 12 and the second exciting electrode 13 by way of the inner leads 31a, the bumps E, the mount electrodes 15, 16 and the lead out electrodes 19, 20, and the pair of vibrating arm portions 8, 9 can be vibrated by a predetermined frequency in directions of being proximate to and remote from each other. Further, by utilizing the vibration of the pair of vibrating arm portions 8, 9, the vibration can be utilized as a timing source, a reference signal source or the like of a time source, a control signal.

Figure 4:
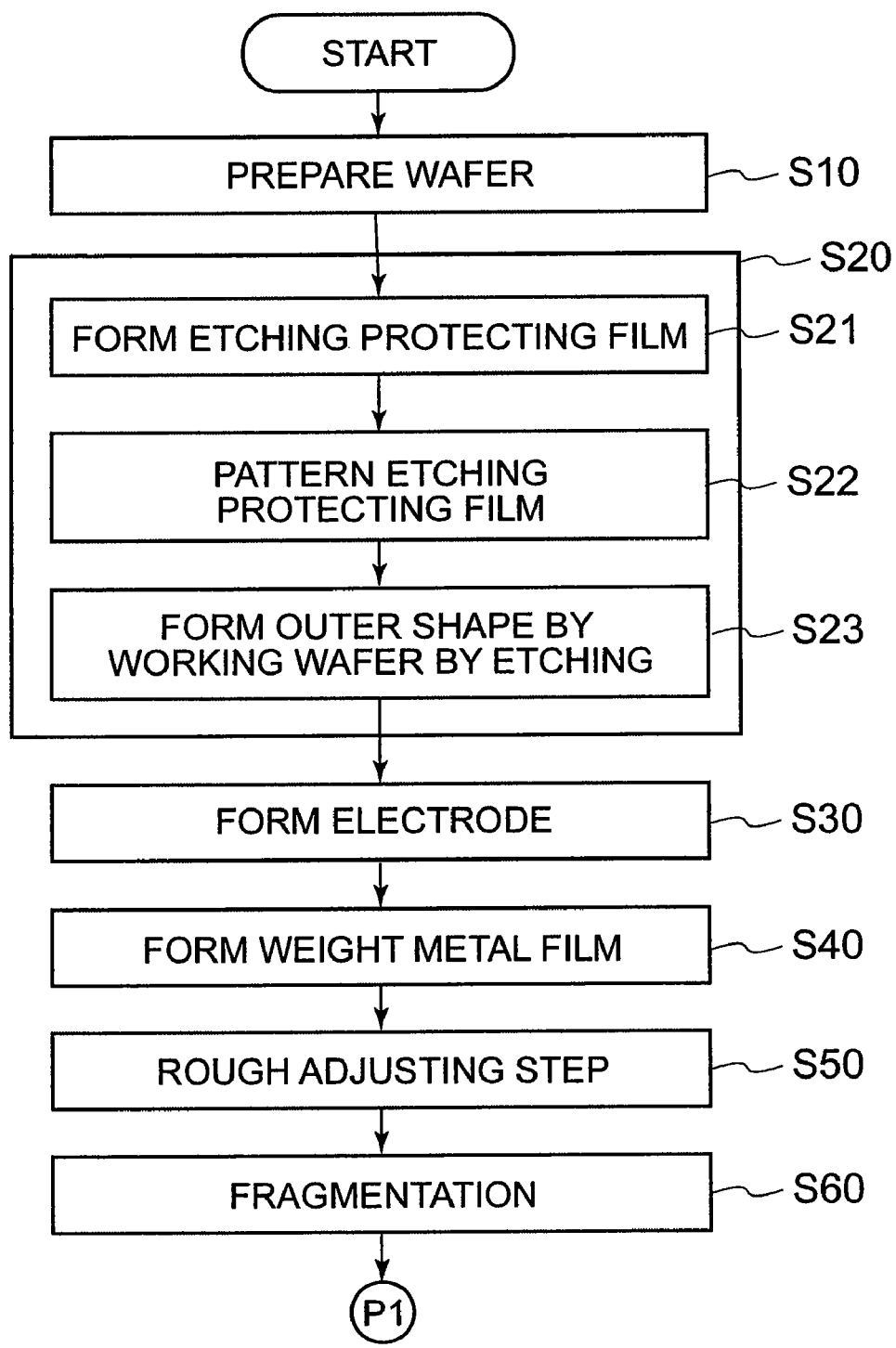
FIG. 4 is a flowchart in fabricating a piezoelectric vibrator shown in FIG. 1.
Figure 5:
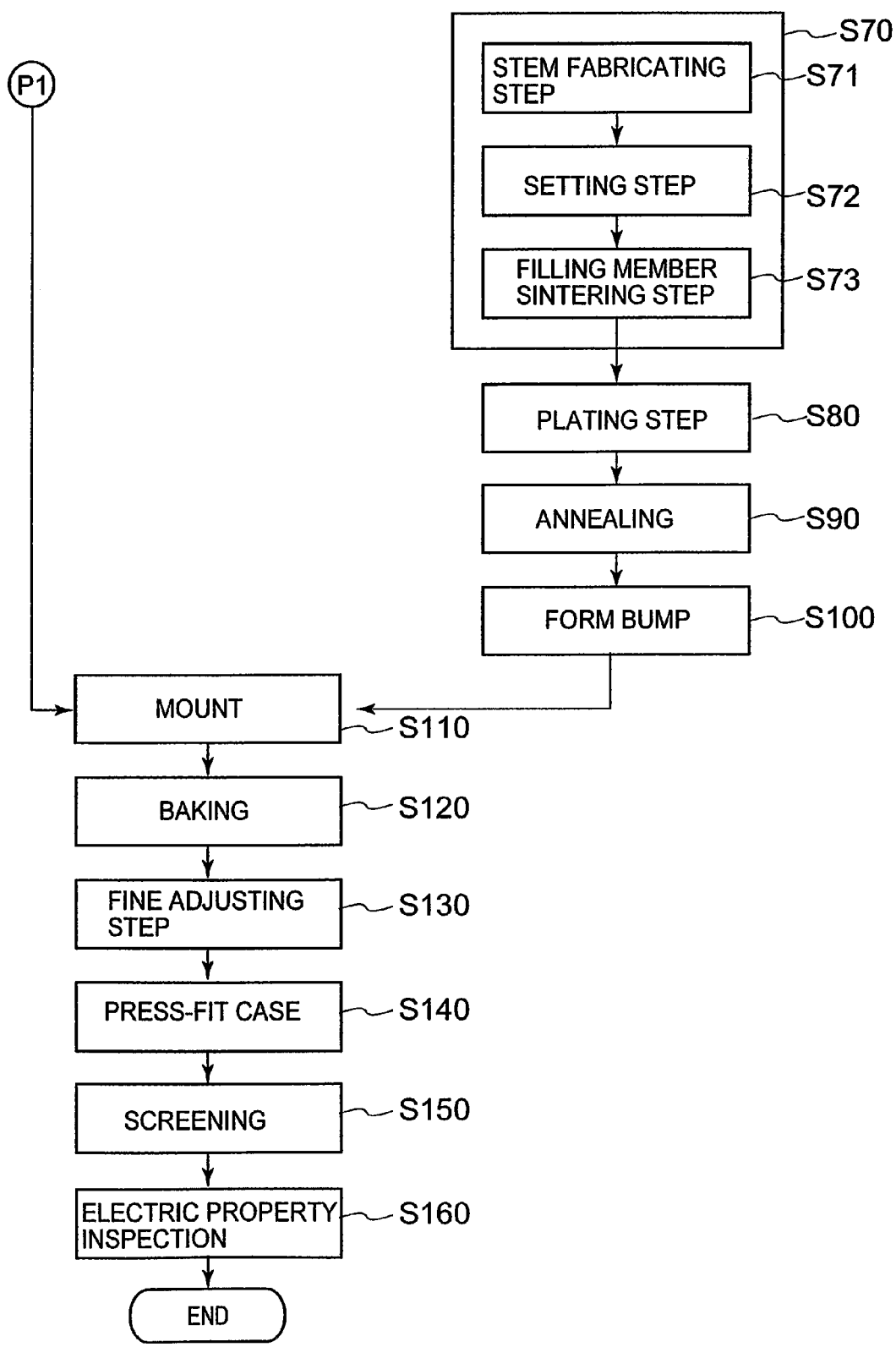
FIG. 5 is a continuation of the flowchart shown in FIG. 4.

Next, a method of fabricating a plurality of the above-described piezoelectric vibrators 1 at a time will be explained in reference to a flowchart shown in FIG. 4 and FIG. 5.

Specifically, first, Lamburt raw stone is sliced by a predetermined angle to constitute the wafer S having a constant thickness. Successively, the wafer is roughly worked by lapping, thereafter, a work denatured layer is removed by etching, thereafter, subjected to mirror face polishing of polishing or the like to constitute the wafer S of the predetermined thickness (S10).

Figure 6:
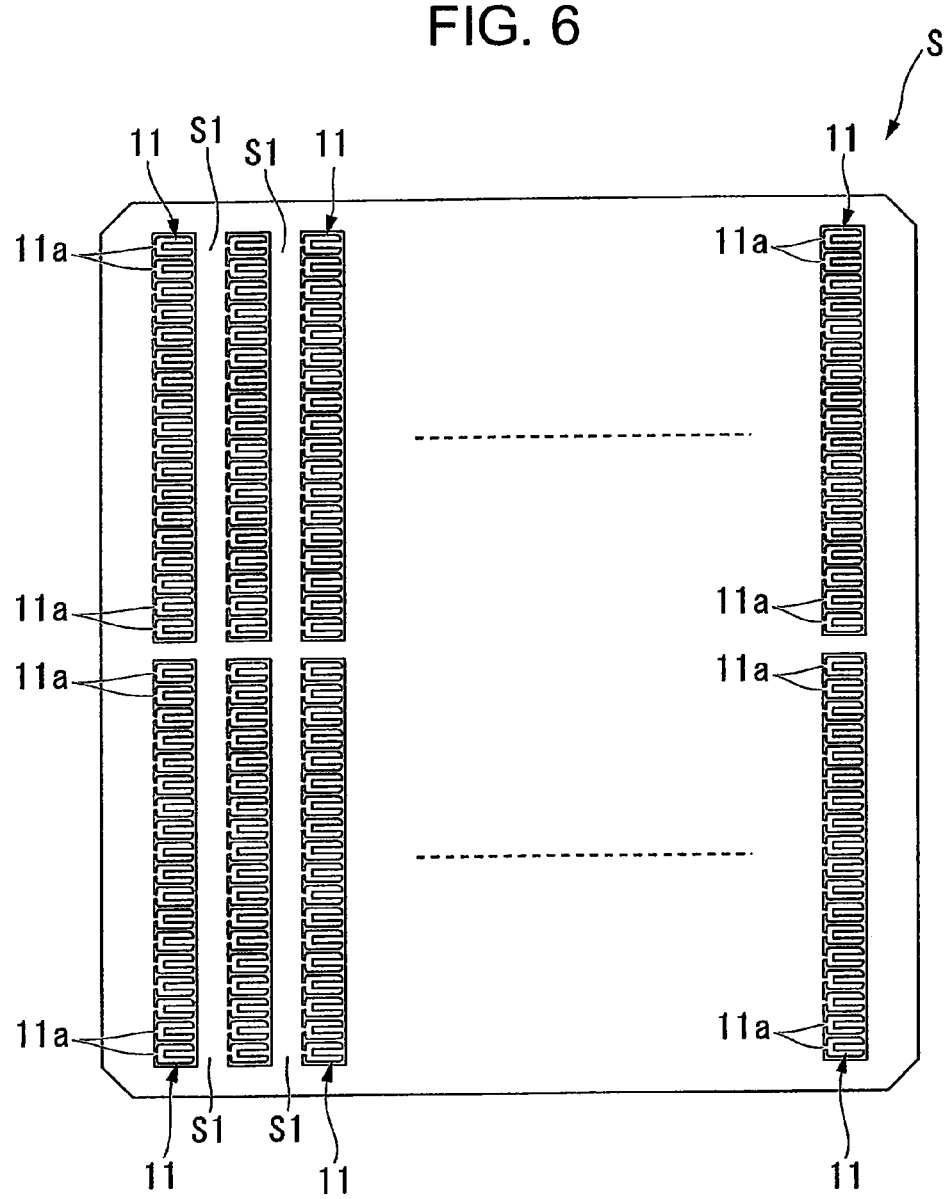
FIG. 6 is a view showing one step in fabricating the piezoelectric vibrator shown in FIG. 1 and is a view of a state of a wafer after finishing an outer shape forming step.

Next, by etching the wafer S as polished by a photolithography technology, as shown by FIG. 6, there is carried out an outer shape forming step of forming a frame portion S1 and forming a plurality of the piezoelectric plates 11 to be connected to the frame portion S1 (S20). At this occasion, etching is carried out such that the plurality of piezoelectric plates 11 are connected in a cantilever shape by way of connecting portions 11a in a state of directing base end sides thereof to the frame portion S1. In the following, a procedure until forming the wafer S as shown by FIG. 6 from the wafer S as polished will specifically be explained.

Figure 7:
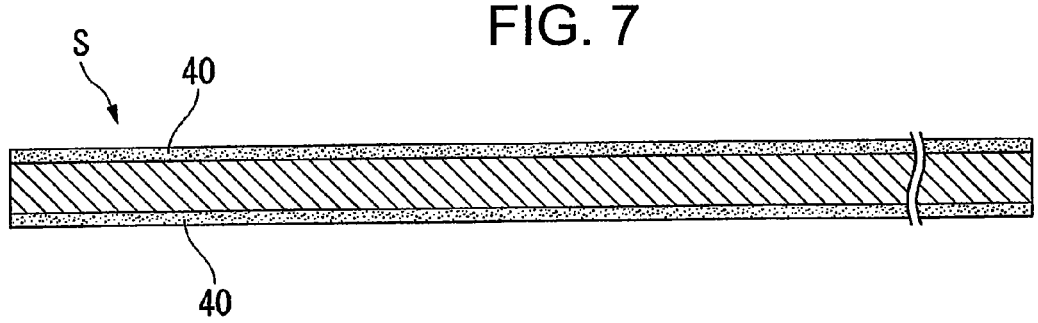
FIG. 7 is a view showing one step in fabricating the piezoelectric vibrator shown in FIG. 1 and is a view showing a state of forming etching protecting films on both faces of the wafer.
Figure 8:
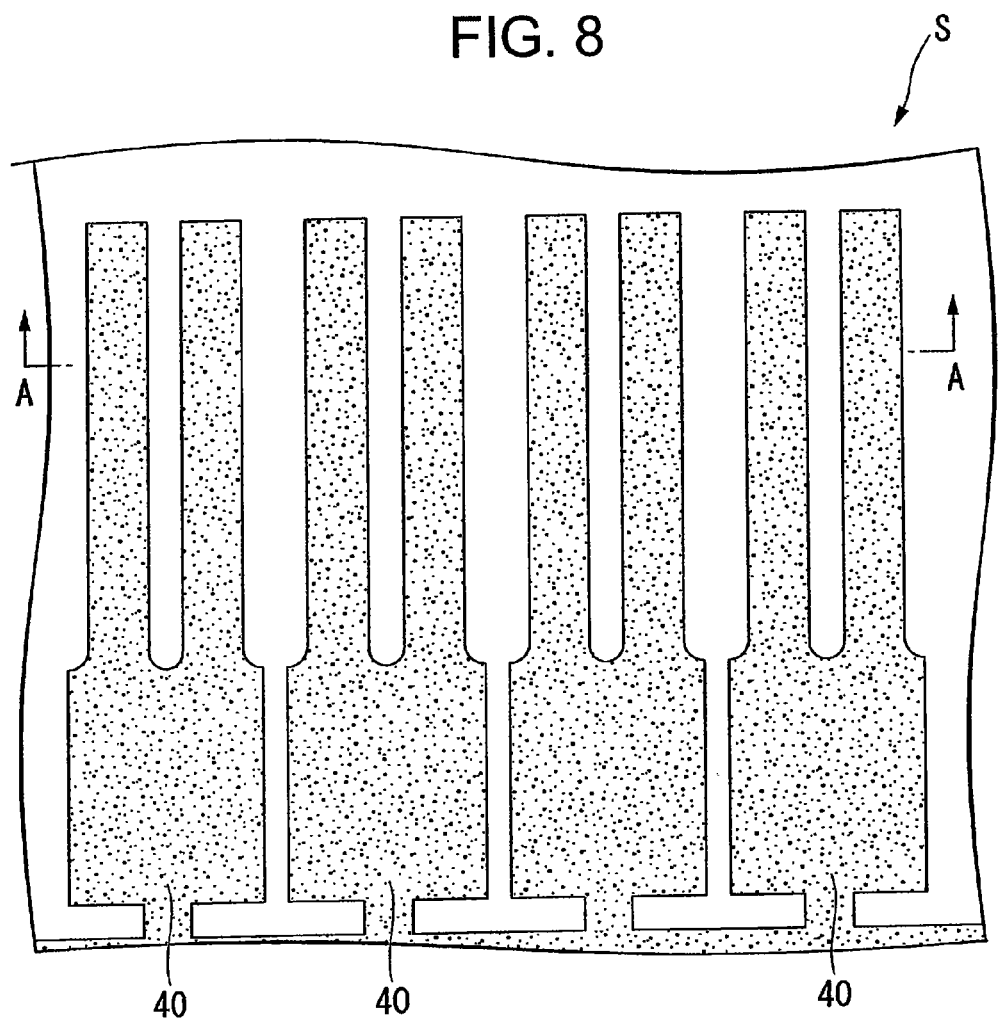
FIG. 8 is a view showing a state of patterning the etching protecting film to an outer shape of a piezoelectric plate of the piezoelectric vibrating piece from the state shown in FIG. 7.
Figure 9:
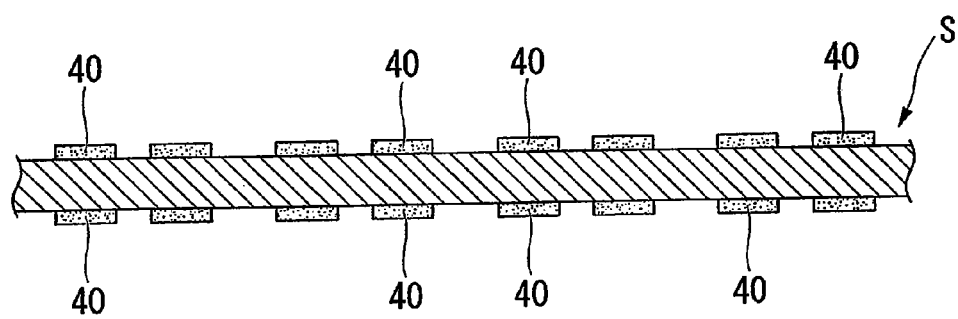
FIG. 9 is a sectional view taken along a line A-A shown in FIG. 8.
Figure 10:
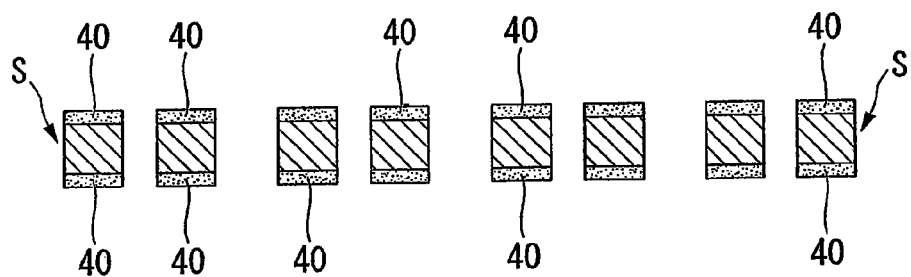
FIG. 10 is a view showing a state of etching the wafer by constituting a mask by the etching protecting film from a state shown in FIG. 9.

First, the wafer S finished with polishing is prepared, thereafter, as shown by FIG. 7, etching protecting films 40 are respectively formed on both faces of the wafer S (S21). As the etching protecting film 40, for example, chromium (Cr) is formed by several μm. Next, a photoresist film, not illustrated, is patterned on the etching protecting film 40 by a photolithography technology. At this occasion, patterning is carried out to surround surroundings of the frame portion S1, the piezoelectric plate 11 and the connecting portion 11a. Further, etching is carried out by constituting a mask by the photoresist film, and the etching protecting film 40 which is not masked is selectively removed. Further, after etching, the photoresist film is removed. Thereby, as shown by FIG. 8 and FIG. 9, the etching protecting film 40 can be patterned to the above-described shape (S22). That is, patterning can be carried out to a shape in which a plurality of the piezoelectric plates 11 are connected thereto in a cantilever shape by way of the connecting portion 11a in the state of directing the base end sides to the frame portion S1. Further, at this occasion, patterning is carried out by a number of the plurality of piezoelectric plates 11. Further, FIG. 9 and FIG. 10 are views showing a section along a cut line A-A.

Next, the both faces of the wafer S are respectively etched by constituting a mask by the patterned etching protecting film 40 (S23). Thereby, as shown by FIG. 10, the frame portion S1 can be formed by selectively removing a region of the etching protecting film 40 which is not masked, and the plurality of piezoelectric plates 11 can be formed to be connected to the frame portion S1. At the time point, the outer shape forming step is finished.

Figure 11:
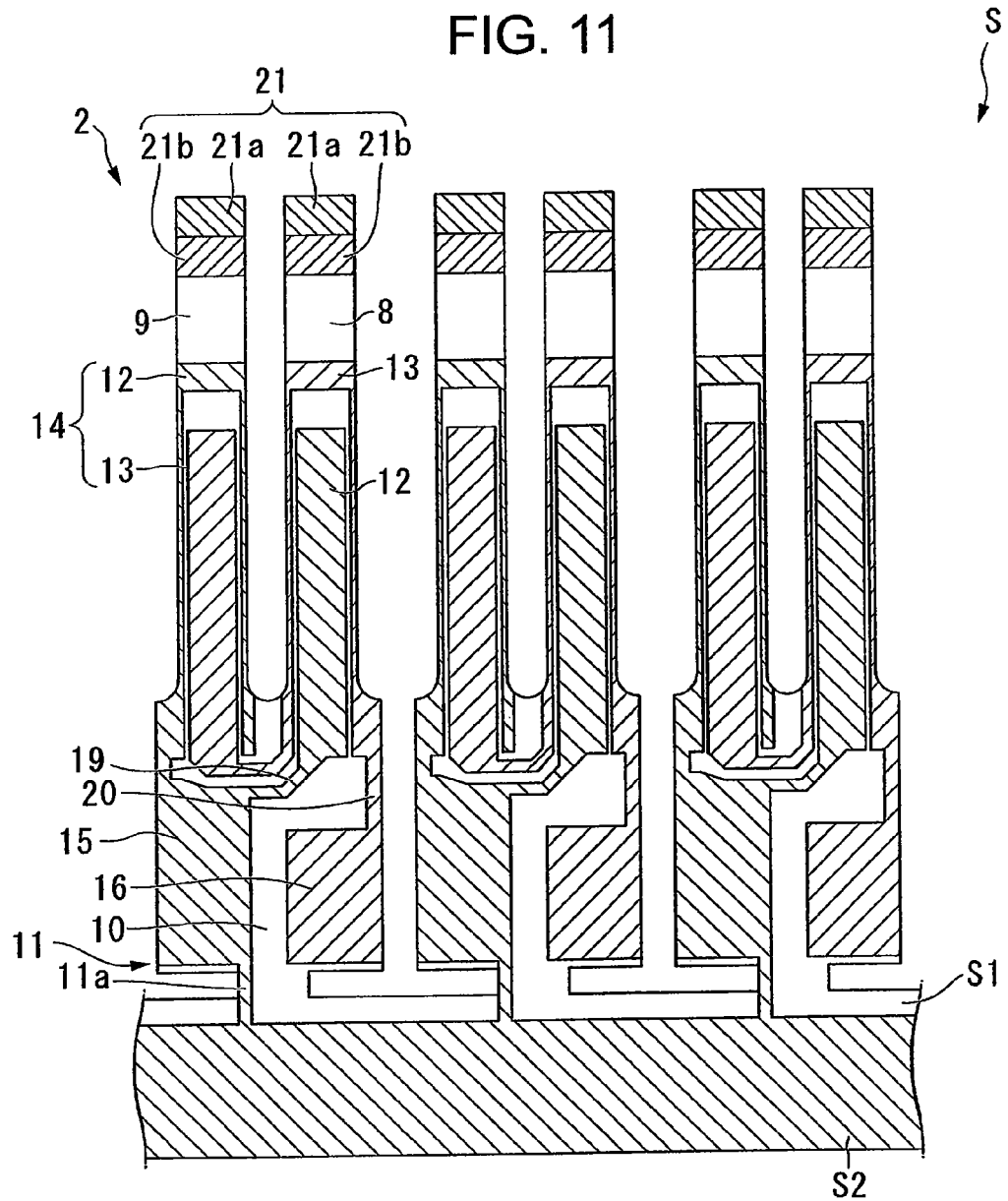
FIG. 11 is a view showing a state of forming an electrode film and a weight metal film on a wafer from the state shown in FIG. 10 and is a view enlarging an upper face of the wafer.

Next, there is carried out an electrode forming step of respectively forming a pair of exciting electrodes 14, the pairs of mount electrodes 15, 16 and the leadout electrodes 19, 20 to the plurality of piezoelectric plates 11 as shown by FIG. 11 by patterning an electrode film at the wafer S and forming a common electrode S2 on the frame portion S1 (S30). At this occasion, the common electrode S2 is formed to be respectively electrically connected to the plurality of mount electrodes 15 on one side by way of the connecting portion 11a. Thereby, all of the mount electrodes 15 on one side respectively formed on the plurality of piezoelectric plates 11 connected to the frame portion S1 are brought into a state of being conducted to the common electrode S2.

By being processed by the outer shape forming step and the electrode forming step, a prepared wafer S having the predetermined thickness can be worked to the wafer S connected with the plurality of piezoelectric vibrating pieces 2 each having the piezoelectric plate 11, the pair of exciting electrodes 14, and the pair of mount electrodes 15, 16, and the wafer S including the frame portion S1 connected thereto in a cantilever shape by way of the connecting portion 11a, the common electrode S2 formed to be electrically connected to the mount electrodes 15 on one side of the plurality of piezoelectric vibrating plates 2 by way of the connecting portion 11a on the frame portion S1 in the state of directing the base end side.

Further, at a timing the same as or before or after the electrode forming step, front ends of the pair of vibrating arm portions 8, 9 are coated with the weight metal films 21 (for example, silver, gold or the like) each including the roughly adjusting film 21a and the finely adjusting film 21b for the frequency adjustment (S40).

Further, there is carried out a roughly adjusting step (frequency adjusting step) of adjusting the frequency of the piezoelectric plate 11 while vibrating the pair of vibrating arm portions 8, 9 of the piezoelectric plate 11 (S50). Specifically explaining, first, the wafer S formed with the electrode film (pair of exciting electrodes 14, pair of mount electrodes 15, 16, readout electrodes 19, 20 and common electrodes S2) and the weight metal film 21 is set to a frequency adjustor (for example, oscillating circuit, network analyzer or the like), not illustrated. Further, a terminal (for example, probe or the like) of the frequency adjustor is contacted to the electrode film on the wafer S by a method mentioned later, and a predetermined drive voltage is applied to the pair of exciting electrodes 14. Thereby, the pair of vibrating arm portions 8, 9 are oscillated. The frequency is adjusted by reducing weights applied to front ends of the pair of vibrating arm portions 8, 9 by irradiating laser light to the roughly adjusting film 21a of the weight metal film 21 while measuring the frequency at this occasion by the frequency adjustor. Further, fine adjustment of the further highly accurately adjusting frequency will be carried out later. An explanation thereof will be given later.

Next, there is carried out a cutting step of cutting to separate a plurality of the piezoelectric plates 11 from the frame portion S1 to respectively fragment by cutting the connecting portion 11a of connecting the wafer S and the piezoelectric plates 11 (S60). Thereby, a plurality of the piezoelectric vibrating pieces 2 each formed with the pair of exciting electrodes 14 and the pair of mount electrodes 15, 16 on the outer surface of the piezoelectric plate 11 can be fabricated at a time from the single wafer S. Further, the connecting portion 11a is cut by the cutting step, and therefore, also the mount electrode 15 on one side connected to the common electrode S2 by way of the connecting portion 11a is simultaneously cut to separate. Therefore, the mount electrode 15 on one side is constituted by the shape of being formed to be brought into contact with an edge side of the base end of the piezoelectric plate 11 as shown by FIG. 2 and FIG. 3.

Next, there is carried out an airtight terminal fabricating step of fabricating the plug 4 (S70). Specifically, first, the stem 30 is fabricated by a stem fabricating step (S71). That is, a bottomed cylinder member is formed by working a plate member having a conductivity of iron nickel cobalt alloy, iron nickel alloy or the like into a lance, thereafter, carrying out a plurality of times of deep drawing. Further, the stem 30 is fabricated by forming an opening at a bottom face of the cylinder member and cutting to separate the cylinder member from the plate member by carrying out outer shape drawing.

Next, a setting step of respectively setting the lead terminal 31 and the filling member 32 to inside of the stem 30 is carried out (S72). First, the fabricated stem 30 is set to an exclusive jig, not illustrated, thereafter, the filling member 32 previously sintered in a ring-like shape is set to inside of the stem 30, and the lead terminal 31 is set to penetrate the filling member 32.

The stem 30 and the lead terminal 31 and the filling member 32 are combined by a setting step, thereafter, the jig is put into a heating furnace and the filling member 32 is sintered in a temperature atmosphere around 1000° C. Thereby, an interval between the filing member 32 and the lead terminal 31 and an interval between the filling member 32 and the stem 30 are completely sealed, and a structure of withstanding airtightness is constituted. Further, the plug 4 can be provided by taking out the plug 4 from the jig. At the time point, the airtight terminal fabricating step is finished.

Next, there is carried out a plating step of coating a metal film of the same material on an outer surface of the lead terminal 31 and an outer periphery of the stem 30 by wet plating (S80). As a pretreatment therefor, the outer surface of the lead terminal 31 and the outer periphery of the stem 30 are cleaned, and degreased by an alkaline solution, thereafter, cleaned by an acid by a solution of hydrochloric acid and sulfuric acid. After finishing the pretreatment, a matrix film is formed on the outer surface of the lead terminal 31 and the outer peripheral face of the stem 30. For example, Cu plating or Ni plating is coated by a film thickness of substantially 2 μm through 5 μm. Successively, a finish film is formed on the matrix film. For example, other than a single material of tin, silver or the like, heat resistant plating, tin copper alloy, tin bismuth film alloy, tin antimony alloy or the like is coated by a film thickness of substantially 8 μm through 15 μm.

By coating the metal film including the matrix film and the finish film in this way, the inner lead 31a and the piezoelectric vibrating piece 2 can be connected. Further, not only connecting the piezoelectric vibrating piece 2, but the stem 30 and the case 3 can be subjected to cold pressure welding since the metal film coated on the outer periphery of the stem 30 is provided with a property of being soft and elastically deformed, and airtight bonding can be carried out.

Successively, annealing is carried out in a furnace in a vacuum atmosphere to stabilize the metal film (S90). For example, heating is carried out for one hour at a temperature of 170° C. Thereby, whisker can be restrained from being brought about by adjusting a composition of an intermetalic compound formed at an interface of a material of the matrix film and a material of the finish film. At a time point of finishing the annealing, the mount step can be carried out. Further, although in coating the metal film, an example is taken by a case of carrying the coating by the wet plating method, the invention is not limited to the case but the coating may be carried out by, for example, a vapor deposition method, a chemical gas phase method or the like.

Further, according to the embodiment, after finishing the annealing, a conductive bump E of gold or the like is formed at a front end of the inner lead 31a for a mount step which is successively carried out (S100). Further, the mount step of bonding the mount electrode 15, 16 of the piezoelectric vibrating piece 2 and the inner leads 31a is carried out (S110). Specifically, the inner lead 31a and the piezoelectric vibrating piece 2 are overlapped by a predetermined pressure in a state of interposing the bump E therebetween. Thereby, the inner leads 31a and the mount electrodes 15, 16 can be connected by way of the bump E. As a result, the piezoelectric vibrating piece 2 can be mounted. That is, the piezoelectric vibrating piece 2 is brought into a state of being mechanically supported by and electrically connected to the lead terminal 31.

Further, although in carrying out bump connection, mounting is carried out by carrying out heating and pressurizing, the bump connection may be carried out by utilizing an ultrasonic wave.

Next, before carrying out a sealing step in order to eliminate a strain by mounting, baking is carried out at a predetermined temperature (S120). Successively, the frequency of the piezoelectric vibrating piece 2 is finely adjusted (S130). Specifically explaining the frequency adjustment, the piezoelectric vibrating piece 2 is vibrated by applying a voltage between the outer leads 31b in a state of putting a total to a vacuum chamber. Further, the frequency is adjusted by evaporating the fine adjusting film 21b of the weight metal film 21 by laser while measuring the frequency. Further, in order to measure the frequency, the measurement can accurately be carried out by pressing a front end of a probe, not illustrated, to the outer lead 31b. The frequency of the piezoelectric vibrating piece 2 can be adjusted within a previously determined range of the frequency by carrying out the frequency adjustment.

Further, although the frequency adjustment is carried out by evaporating the weight metal film 21 by irradiating laser in the fine adjustment and the rough adjustment which is carried out previously, the frequency adjustment may be carried out by utilizing not laser but argon ion. In this case, the frequency adjustment is carried out by removing the weight metal film 21 by carrying out the sputtering by irradiating argon ion.

Finally, there is carried out a case press-fitting step of sealing the piezoelectric vibrating piece 2 in airtight by press-fitting the case 3 to the stem 30 to contain the mounted piezoelectric vibrating piece 2 at inside thereof (S140). Specifically explaining, the case 3 is press-fit to the outer periphery of the stem 30 while applying a predetermined load in vacuum. Then, the metal film formed on the outer periphery of the stem 30 is elastically deformed, and therefore, airtight sealing can be carried out by cold pressure welding. Thereby, the piezoelectric vibrating piece 2 can be sealed in vacuum at inside of the case 3.

Further, it is preferable to detach a moisture or the like adsorbed to the surface by sufficiently heating the piezoelectric vibrating piece 2, the case 3 and the plug 4 before carrying out the step.

Further, after finishing to fix the case 3, screening is carried out (S150). The screening is carried out for stabilizing the frequency and a resonance resistance value and restraining metal whisker caused by a compressive stress from being brought about at a fitting portion of press-fitting the case 3.

After finishing the screening, an electric property inspection of an inner portion is carried out (S160). That is, a resonance frequency, a resonance resistance value, a drive level property (exciting power dependency of resonance frequency and resonance resistance value) or the like are measured and checked. Further, an insulating resistance property or the like is checked along therewith. Further, finally, a dimension, a quality or the like is finally checked by carrying out an outlook inspection of the piezoelectric vibrator 1. As a result, the piezoelectric vibrator 1 shown in FIG. 1 can be fabricated.

Particularly, the mount electrode 15 on one side is conducted to the common electrode S2 formed on the frame portion S1, and therefore, in carrying out the rough adjusting step, different from the background art, the pair of vibrating arm portions 8, 9 of the piezoelectric plate 11 can be vibrated by applying the drive voltage by contacting the terminals of the frequency adjustor respectively to the common electrode S2 and the mount electrode 16 on other side. In the case of the background art, it is necessary to contact the terminals to both of the pair of mount electrodes 15, 16. That is, it is necessary to contact the two terminals to the one piezoelectric plate 11. Therefore, in order to carry out the contact accurately, it is necessary to accurately position the two terminals to the pair of mount electrodes 15, 16 in a state of being as proximate as possible.

In contrast thereto, when the common electrode S2 is utilized, the one terminal may be contacted to the common electrode S2 formed at the frame portion S1 and other terminal may be contacted to the mount electrode 16 on other side, and therefore, it is not necessary to make the two terminals proximate to each other. That is, the mount terminal may be contacted to the one piezoelectric plate 11. Therefore, a control of the terminal can easily be carried out, and the frequency adjustment can be carried out further speedily and accurately. Further, an efficient operation can be carried out.

Further, in the roughly adjusting step, it is preferable that the pairs of the vibrating arm portions 8, 9 of the piezoelectric plates 11 are not vibrated set by set but the frequency of the piezoelectric plates 11 is adjusted by simultaneously vibrating a plurality of sets of the pairs of vibrating arm portions 8, 9 of the piezoelectric plates 11 by applying the drive voltage by contacting the terminals to the mount electrodes 16 on other side of the plurality of the piezoelectric plates 11. Specifically, for example, the plurality of piezoelectric plates 11 connected to the wafer S shown in FIG. 6 are divided by the unit of the row, the frequency of the piezoelectric plates 11 is adjusted for the respective divided rows. Thereby, the frequency adjustment can further efficiently be carried out and a fabrication efficiency can be promoted.

Meanwhile, when the plurality of sets of the pairs of vibrating arm portions 8, 9 of the piezoelectric plates 11 are vibrated in the background art, it is necessary to contact the terminals respectively to the pair of mount electrodes 15, 16 of the respective piezoelectric plates 11, and therefore, a number of the terminals needs to be twice as much as the number of the piezoelectric plates 11.

In contrast thereto, the common electrode S2 is utilized, and therefore, the terminals may be contacted to the common electrode S2 and the mount electrodes 16 on other side of the respective piezoelectric plates 11. Therefore, the number of the terminals may not be the number twice as much as the number of the piezoelectric plates 11 to be vibrated but may be the number of adding the number of the piezoelectric plates 11 to be vibrated and one for the common electrode S2. Therefore, the number of the terminals can considerably be reduced in comparison with that of the background art and a reduction in cost can be achieved. Further, the number of the terminals can be reduced considerably, the one terminal may be contacted to the one piezoelectric plate 11, and therefore, the control of the terminal becomes easy invariably. Therefore, the frequency adjustment can easily and accurately be carried out even in the case of carrying out the frequency adjustment simultaneously for the plurality of piezoelectric plates 11.

Further, even when an interval between the piezoelectric plates 11 contiguous to each other is narrowed, assumedly, by achieving further small-sized formation, only the one terminal may be contacted to the one piezoelectric plate 11, and therefore, the contact can easily be carried out. Therefore, the frequency adjustment can firmly be carried out without being influenced by the size of the piezoelectric vibrating piece 2.

In addition thereto, the number of the terminals can considerably be reduced, and therefore, a number of steps consumed for maintenance of the terminal can be reduced. Thereby, promotion of maintenance performance can be achieved.

Further, when the terminal of the frequency adjustor is contacted to the electrode film, normally, a contact mark, not illustrated, is formed at a contact portion of the electrode film. However, as described above, the terminal is not contacted to the mount electrode 15 on one side, and therefore, the contact mark is not formed.

Further, according to the piezoelectric vibrator 1 of the embodiment, the above-described piezoelectric vibrating piece 2 is provided, and therefore, the predetermined frequency can be ensured, and high quality formation and low cost formation and the piezoelectric vibrator 1 can be achieved.

Figure 12:
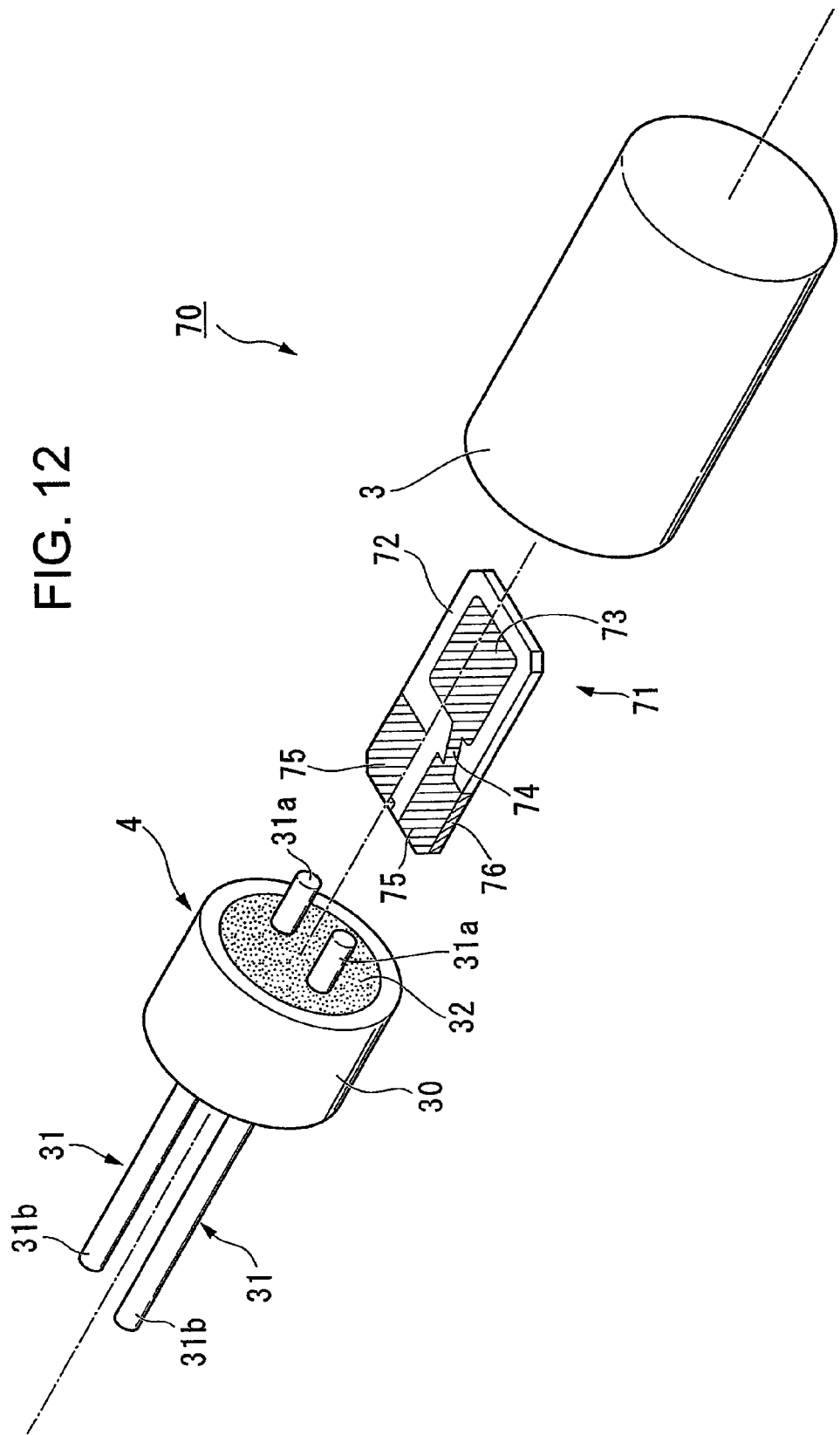
FIG. 12 is a view showing other examples of a piezoelectric vibrating piece and a piezoelectric vibrator according to the invention and is a disassembled perspective view of the piezoelectric vibrator having the piezoelectric vibrating piece of carrying out a thickness slipping vibration.

Further, as shown by FIG. 12, although according to the embodiment, an explanation has been given by taking an example of the piezoelectric vibrator 1 including the piezoelectric vibrating piece 2 of the tuning fork type, the invention is not limited to the piezoelectric vibrator 1.

For example, a thickness slipping vibrator (piezoelectric vibrator) 70 having a thickness slipping vibrating piece (piezoelectric vibrating piece) 71 will do. The thickness slipping vibrating piece 71 includes a piezoelectric vibrating plate 72 formed from the wafer S in a plate-like shape by a constant thickness, an exciting electrode 73, a readout electrode 74, and a mount electrode 75. The piezoelectric vibrating plate 72 is formed, for example, in a rectangular shape in an outer shape thereof, and formed such that the exciting electrodes 73 are opposed to each other substantially at center portions of both faces. An end portion of the piezoelectric plate 72 is formed with the mount electrode 75 electrically connected to the exciting electrode 73 by way of the leadout electrode 74. Further, the mount electrode 75 connected to the exciting electrode 73 on one side and the mount electrode 75 connected to the exciting electrode 73 on other side are respectively formed at both faces of the piezoelectric plate 72. At this occasion, the mount electrode 75 formed at one face of the piezoelectric plate 72 is electrically connected to the mount electrode 75 formed at other face thereof by way of a side face electrode 76 formed on a side face of the piezoelectric plate 72.

Even the thickness slipping vibrator 70 constituted in this way can achieve high quality formation and low cost formation of the thickness slipping vibrator 70 per se similarly, since the thickness slipping vibrating piece 71 is fabricated by the above-described method of fabricating the piezoelectric vibrating piece.

Figure 13:
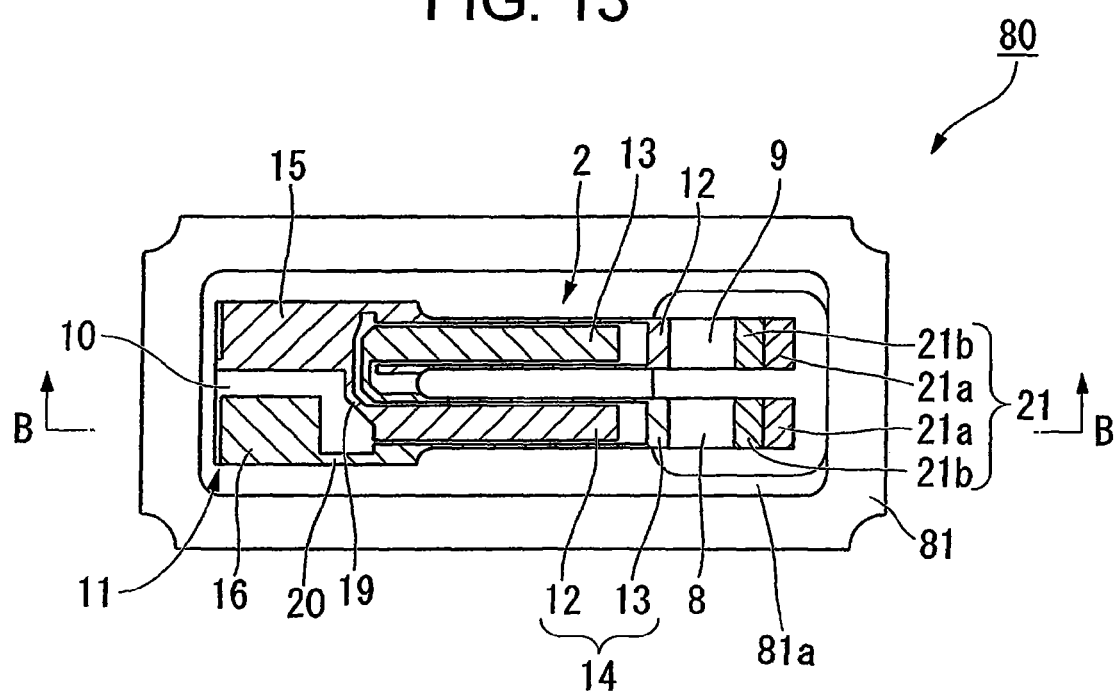
FIG. 13 is a view showing other example of a piezoelectric vibrator according to the invention and is a top view of a piezoelectric vibrator of a ceramic package type.
Figure 14:
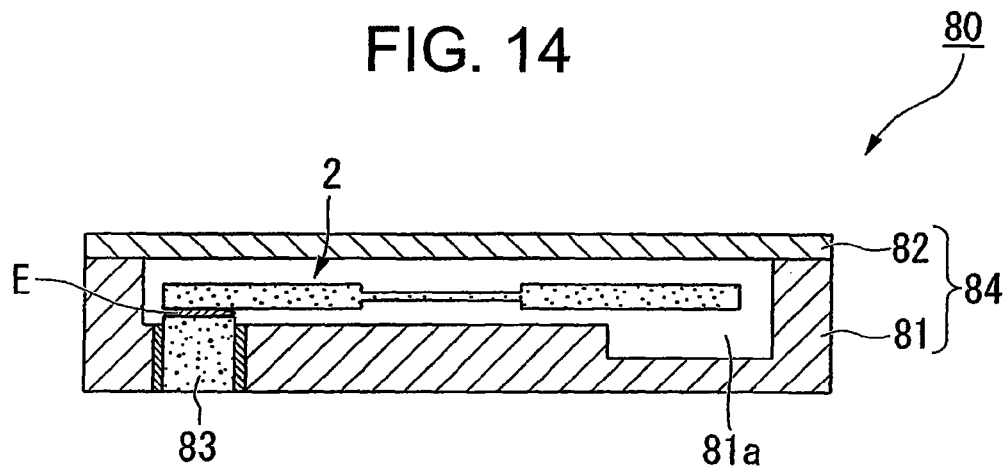
FIG. 14 is a sectional view taken along a line B-B shown in FIG. 13.

Further, although in the embodiment, as an example of the piezoelectric vibrator, an explanation has been given by taking an example of the piezoelectric vibrator 1 of the cylinder package type, the invention is not limited to the piezoelectric vibrator 1. For example, as shown by FIG. 13 and FIG. 14, a piezoelectric vibrator 80 of a ceramic package type will do.

The piezoelectric vibrator 80 includes a base 81 formed with a recess portion 81a at inside thereof, the piezoelectric vibrating piece 2 contained at inside of the recess portion 81a of the base 81, and a lid 82 fixed to the base 81 in a state of containing the piezoelectric vibrating piece 2.

The base 81 is arranged with a lead 83 having a hermetic sealing structure, and a front end thereof is provided with the bump E. Further, the bumps E and the mount electrodes 15, 16 of the piezoelectric vibrating piece 2 are mechanically and electrically connected. Further, the lead 83 is exposed at a bottom face of the base 81. That is, the lead 83 is made to function as an external connecting terminal one end side of which is electrically connected to outside and other end side of which is electrically connected to the mount electrodes 15, 16.

Further, the base 81 is sealed in airtight in vacuum by using various means of electron beam welding in vacuum, seam welding in vacuum, or bonding by a low melting point glass or a eutectic metal or the like. Thereby, the piezoelectric vibrating piece 2 is sealed in airtight at inside thereof. That is, the base 81 and the lid 82 are made to function as a sealing member 84 for sealing the piezoelectric vibrating piece 2 in airtight.

Even the piezoelectric vibrator 80 constituted in this way can achieve high quality formation and low cost formation of the piezoelectric vibrator 80 per se similarly since the piezoelectric vibrating piece 2 is fabricated by the above-described method of fabricating the piezoelectric vibrating piece.

Further, a surface mounting type vibrator 90 may be constituted by fixing the piezoelectric vibrator 1 of the cylinder package type by a mold resin portion 91.

Figure 15:
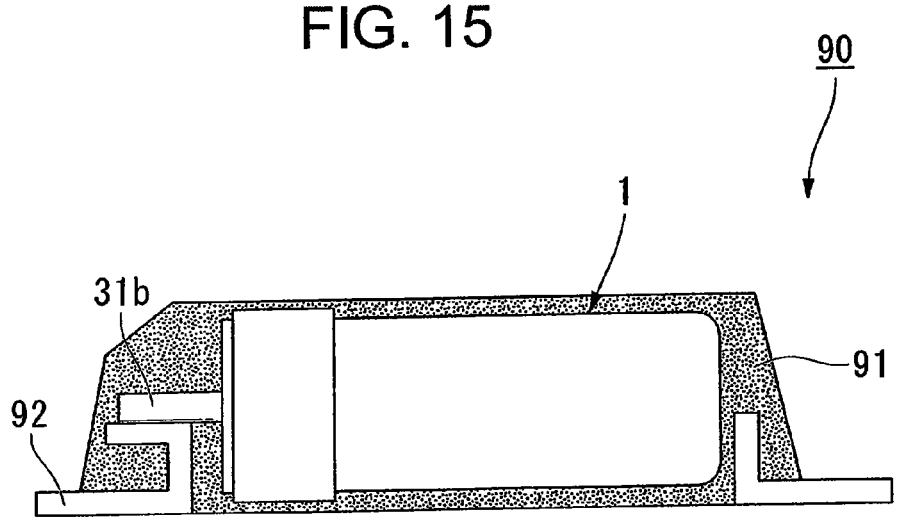
FIG. 15 is a sectional view showing a surface mounting type vibrator having a piezoelectric vibrator according to the invention.
Figure 16:
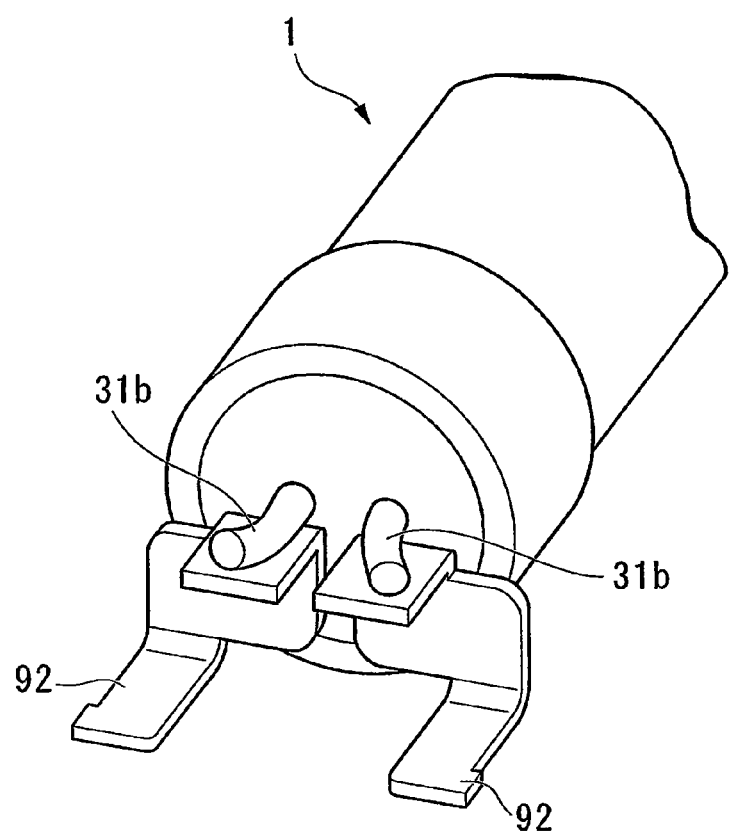
FIG. 16 is a perspective view showing a relationship of attaching the piezoelectric vibrator shown in FIG. 15 and an external portion connecting terminal.

As shown by FIG. 15 and FIG. 16, the surface mounting type vibrator 90 includes the piezoelectric vibrator 1, the mold resin portion 91 of fixing the piezoelectric vibrator 1 by a predetermined shape, and an external portion connecting terminal 92 one end side of which is connected electrically to the outer lead 31b and other end side of which is electrically connected to outside by being exposed at a bottom face of the mold resin portion 91. The external connecting terminal 92 is formed in a channel-like shape in a section thereof by a metal material of copper or the like. By fixing the piezoelectric vibrator 1 by the mold resin portion 91 in this way, the piezoelectric vibrator 1 can stably be attached to a circuit board or the like, and therefore, the piezoelectric vibrator 1 is easier to use and an easiness of use is promoted. Particularly, the piezoelectric vibrator 1 is brought into high quality formation and low cost formation, and therefore, high quality formation and low cost formation can be achieved also with regard to the surface mounting type vibrator 90 per se.

Next, an embodiment of an oscillator according to the invention will be explained in reference to FIG. 17.

Figure 17:
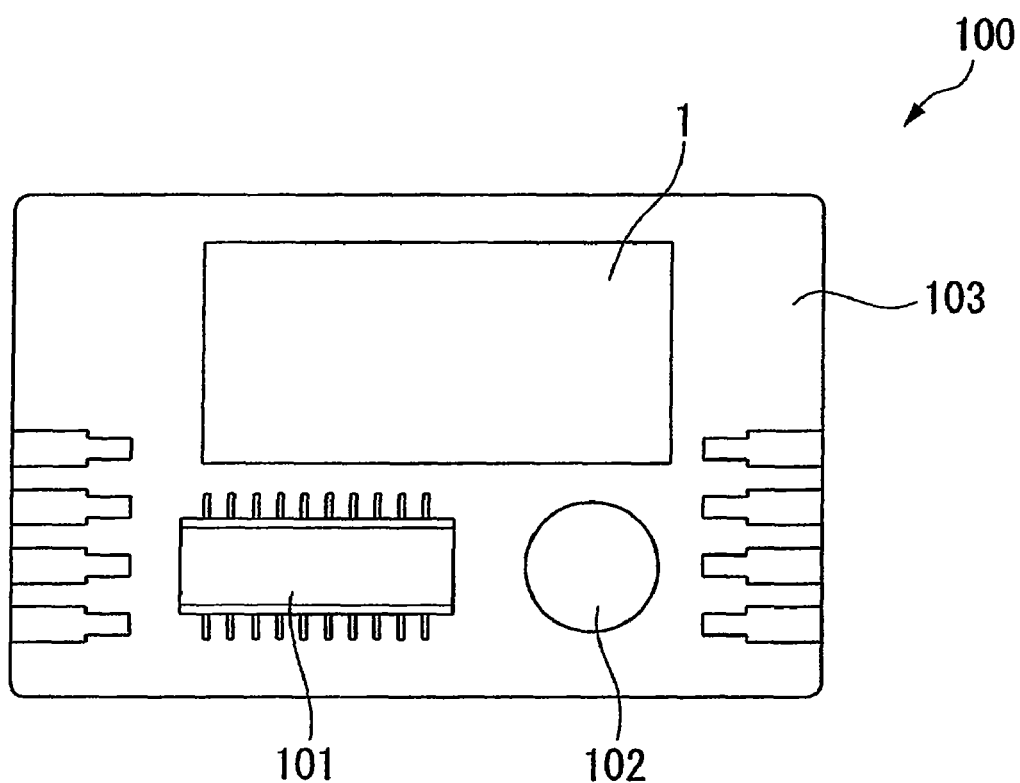
FIG. 17 is a constitution view showing an embodiment of an oscillator according to the invention.

As shown by FIG. 17, an oscillator 100 of the embodiment constitutes the piezoelectric vibrator 1 as an oscillating piece electrically connected to an integrated circuit 101. The oscillator 100 includes a board 103 mounted with an electronic part 102 of a capacitor or the like. The board 103 is mounted with the integrated circuit 101 for the oscillator and a vicinity of the integrated circuit 101 is mounted with the piezoelectric vibrator 1. The electronic part 102, the integrated circuit 101 and the piezoelectric vibrator 1 are respectively electrically connected by a wiring pattern, not illustrated. Further, respective various constituent parts are molded by a resin, not illustrated.

In the oscillator 100 constituted in this way, when a voltage is applied to the piezoelectric vibrator 1, the piezoelectric vibrating piece 2 at inside of the piezoelectric vibrator 1 is vibrated. The vibration is converted into an electric signal by a piezoelectric property provided to the piezoelectric vibrating piece 2 and is inputted to the integrated circuit 101 as the electric signal. The inputted electric signal is variously processed by the integrated circuit 101 and is outputted as a frequency signal. Thereby, the piezoelectric vibrator 1 is made to function as an oscillating piece.

Further, a constitution of the integrated circuit 101 can be added with a function of controlling date or time of operating the apparatus or an external apparatus, providing time, calendar or the like other than a single function oscillator for a timepiece or the like by selecting, for example, RTC (real time clock) module or the like in accordance with a request.

As described above, according to the oscillator 100 of the embodiment, the piezoelectric vibrator 1 brought into high quality formation and low cost formation is provided, and therefore, high quality formation and low cost formation is achieved similarly also in the oscillator 100 per se. Further, in addition thereto, a highly accurate frequency signal which is stable over a long period of time can be provided.

Figure 18:
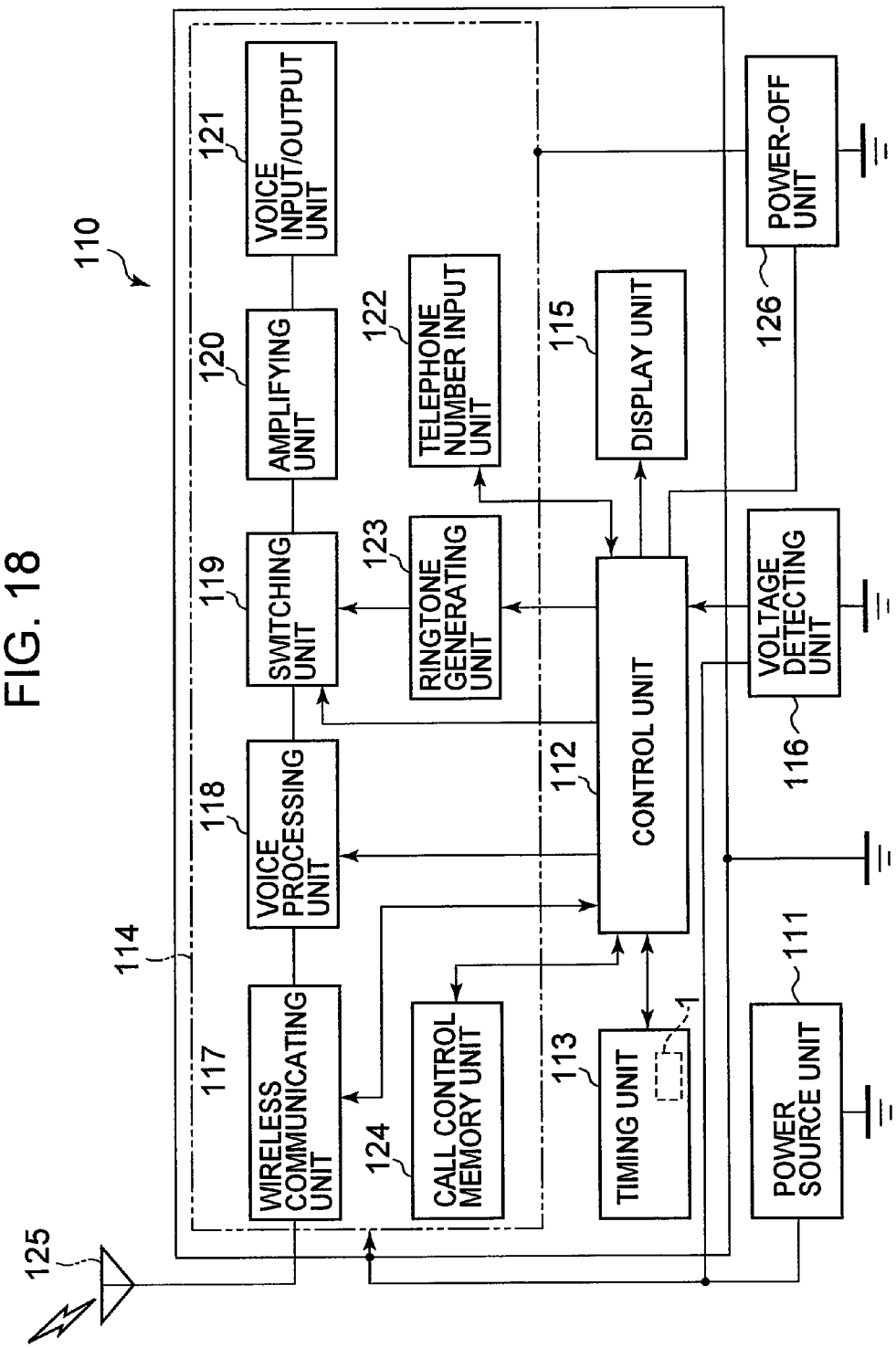
FIG. 18 is a constitution view showing an embodiment of an electronic apparatus according to the invention.

Next, an explanation will be given of an embodiment of an electronic apparatus according to the invention in reference to FIG. 18. Further, as an electronic apparatus, an explanation will be given by taking an example of a portable information apparatus 110 having the piezoelectric vibrator 1. First, the portable information apparatus 110 of the embodiment is represented by, for example, a portable telephone and develops and improves a wristwatch according to the background art. An outlook thereof is similar to a wristwatch, a liquid crystal display is arranged at a portion thereof in correspondence with a dial and current time or the like is displayed on the screen. Further, when utilized as a communicating machine, the electronic apparatus is detached from the wrist, and can carry out a communication similar to that of the portable telephone of the background art by a speaker and a microphone included on an inner side of a strap. However, the electronic apparatus is remarkably small-sized and light-weighted in comparison with the portable telephone of the background art.

Next, a constitution of a portable information apparatus 110 of the embodiment will be explained. As shown by FIG. 18, the portable information apparatus 110 includes the piezoelectric vibrator 1 and a power source portion 111 for supplying a power. The power source portion 111 is constituted by a lithium secondary cell. The power source portion 111 is connected in parallel with a control portion 112 of carrying out various controls, a time counting portion 13 of counting time or the like, a communicating portion 114 for carrying out a communication with outside, a display portion 115 for displaying various information, and a voltage detecting portion 116 of detecting voltages of respective function portions. Further, the power is supplied to the respective function portions by the power source portion 111.

The control portion 112 carries out a control of operating a total of a system of transmitting and receiving voice data, measuring or displaying current time or the like by controlling the respective function portions. Further, the control portion 112 includes ROM previously written with programs, CPU of reading and executing the programs written to ROM, and RAM or the like used as a work area of CPU.

The time counting portion 113 includes an integrated circuit including an oscillating circuit, a register circuit, a counter circuit and an interface circuit or the like, and the piezoelectric vibrator 1. When a voltage is applied to the piezoelectric vibrator 1, the piezoelectric vibrating piece 2 is vibrated, the vibration is converted into an electric signal by a piezoelectric electric property provided to quartz, and is inputted to the oscillating circuit as the electric signal. An output of the oscillating circuit is binalized and counted by the register circuit and the counter circuit. Further, a signal is transmitted and received to and from the control circuit 112 by way of the interface circuit, and current time or current date or calendar information or the like is displayed on the display portion 115.

The communicating portion 114 is provided with a function similar to that of the portable telephone of the background art, and includes a wireless portion 117, a voice processing portion 118, a switching portion 119, an amplifying portion 120, a voice inputting and outputting portion 121, a telephone number inputting portion 122, and arrival sound generating portion 113, and a call control memory portion 124.

The wireless portion 117 exchanges to transmit and receive various data of voice data or the like to and from a base station by way of an antenna 125. The voice processing portion 118 codes and decodes a voice signal inputted from the wireless portion 117 or the amplifying portion 120. The amplifying portion 120 amplifies a signal inputted from the voice processing portion 118 or the voice inputting and outputting portion 121 to a predetermined level. The voice inputting and outputting portion 121 is constituted by a speaker, a microphone or the like for making arrival sound or speech voice loud or collects voice.

Further, the arrival sound generating portion 123 generates arrival sound in accordance with a call from the base station. The switching portion 119 switches the amplifying portion 120 connected to the voice processing portion 118 to the arrival sound generating portion 123 only at arrival of signal, thereby, the arrival sound generated by the arrival sound generating portion 123 is outputted to the voice inputting and outputting portion 121 by way of the amplifying portion 120.

Further, the call control memory portion 124 contains a program related to an emitting and arriving call control of the communication. Further, the telephone number inputting portion 122 includes number keys of 0 through 9 and other key and a telephone number of speech destination or the like is inputted by depressing the number keys and the like.

When a voltage applied to the respective function portions of the control portion 112 and the like by the power source portion 111 becomes lower than a predetermined value, the voltage detecting portion 116 detects the voltage drop to inform to the control portion 112. A predetermined voltage value at this occasion is a value previously set as a minimum voltage necessary for stably operating the communicating portion 114, and becomes, for example, about 3 V. The control portion 112 informed of the voltage drop from the voltage detecting portion 116 prohibits operations of the wireless portion 117, the voice processing portion 118, the switching portion 119 and the arrival sound generating portion 123. Particularly, it is indispensable to stop operating the wireless portion 117 having a large power consumption. Further, the display portion 115 is displayed with a statement that the communicating portion 114 cannot be used by a deficiency in a remaining amount of the battery.

That is, the operation of the communicating portion 114 can be prohibited and the statement can be displayed on the display portion 115 by the voltage detecting portion 116 and the control portion 112. Although the display may be constituted by a character message, as a further intuitive display, a×(check) mark may be attached to a telephone icon displayed at an upper portion of a display face of the display portion 115.

Further, by providing a power source cutting portion 126 capable of selectively cutting a power source of a portion related to the function of the communicating portion 114, the function of the communicating portion 114 can further firmly be stopped.

As described above, according to the portable information apparatus 110 of the embodiment, the piezoelectric vibrator 1 brought into high quality formation and low cost formation is provided, and therefore, also the portable information apparatus per se can achieve high quality formation and low cost formation similarly. Further, in addition thereto, highly accurate timepiece information which is stable over a long period of time can be displayed.

Next, an embodiment of a radiowave timepiece according to the invention will be explained in reference to FIG. 19.

Figure 19:
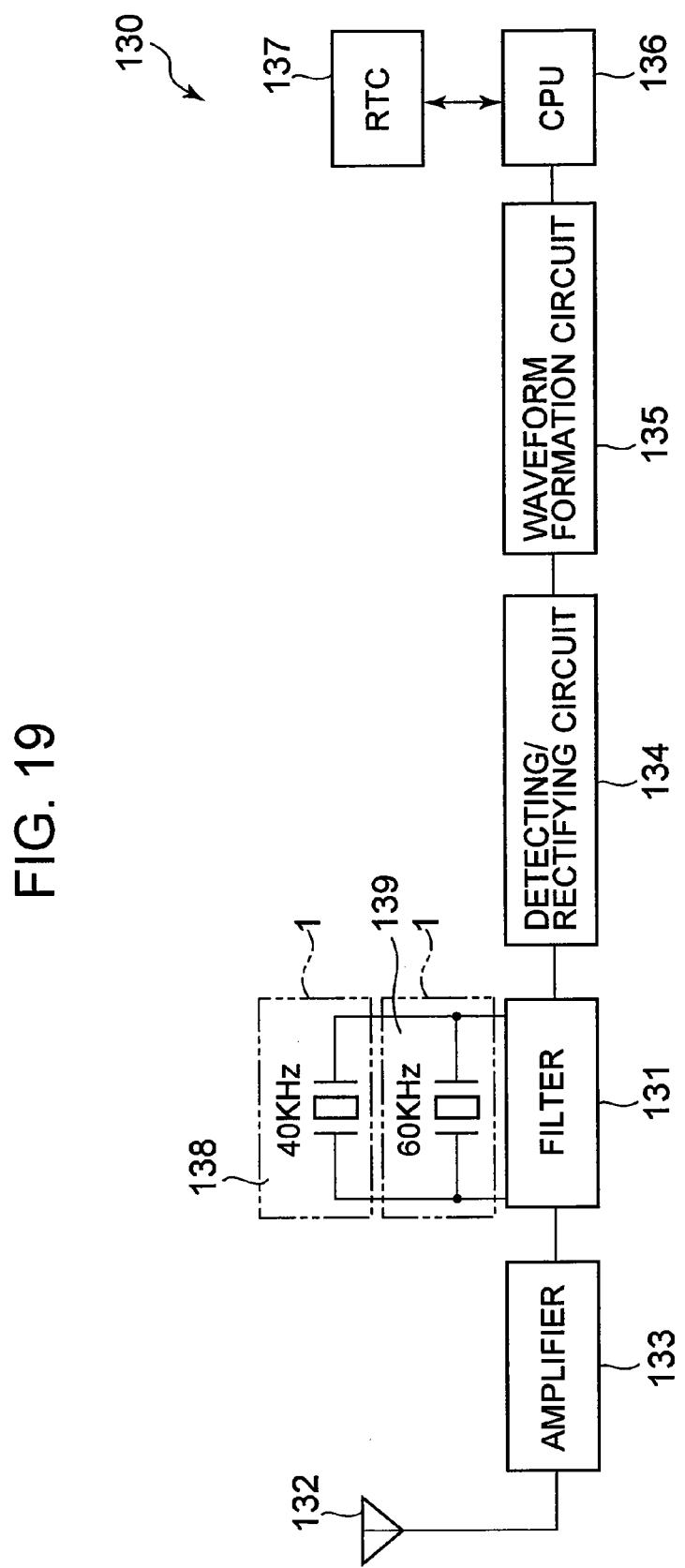
FIG. 19 is a constitution view showing an embodiment of a radiowave timepiece according to the invention.
Figure 20:
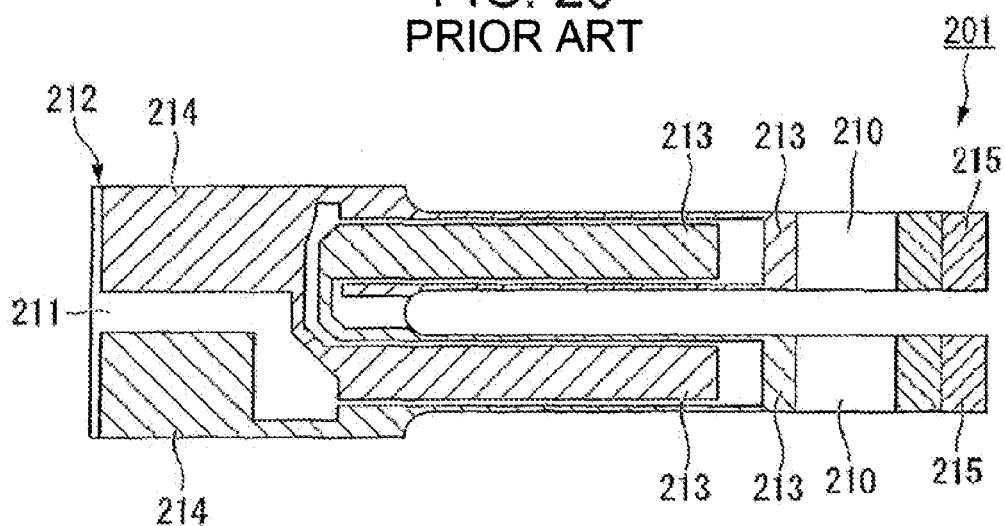
FIG. 20 is a view viewing a piezoelectric vibrating piece of a background art from an upper face.
Figure 21:
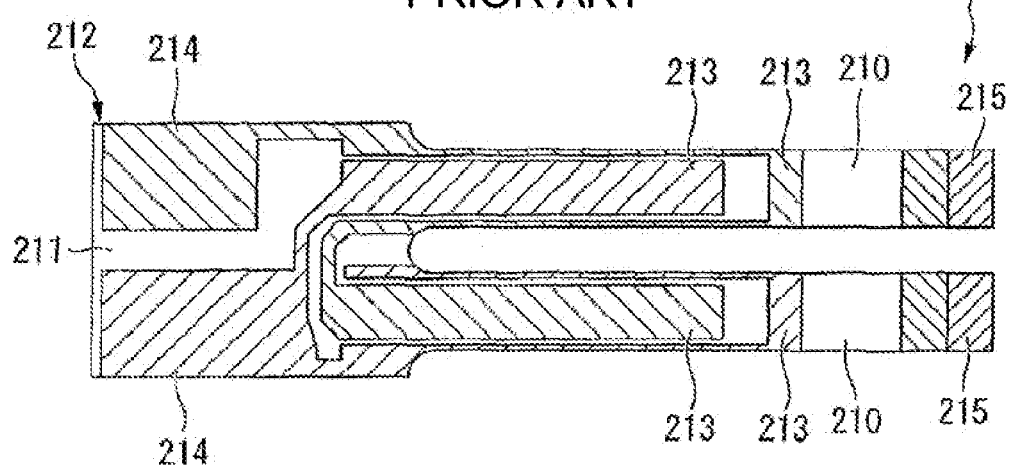
FIG. 21 is a view viewing the piezoelectric vibrating piece of the background art from a lower face.
Figure 22:
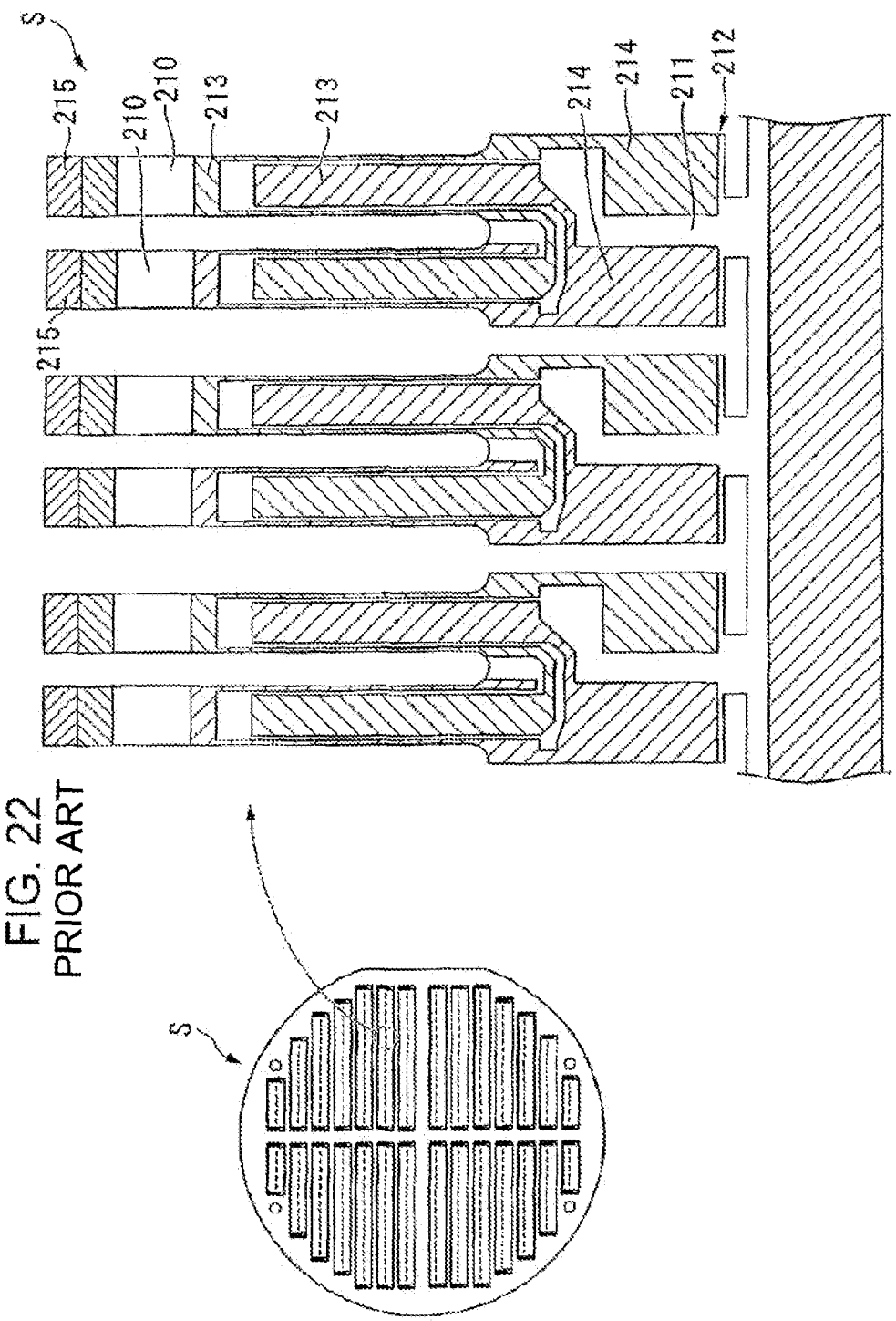
FIG. 22 is a view showing one step of fabricating the piezoelectric vibrating piece shown in FIG. 21 and FIG. 22.

As shown by FIG. 19, a radiowave timepiece 130 of the embodiment includes the piezoelectric vibrator 1 electrically connected to a filter portion 131, and is a timepiece provided with a function of automatically correcting time to accurate time to display by receiving a standard radiowave including time information.

In Japan, there are transmitting places (transmitting stations) for transmitting a standard radiowave at Fukushima prefecture (40 kHz) and Saga prefecture (60 kHz), respectively transmitting the standard radiowave. A long wave of 40 kHz or 60 kHz is provided with both of a property of propagating on the ground surface and a property of propagating while being reflected by the ionosphere and the ground surface, and therefore, a propagating range is wide and all of Japan is covered by the above-describe two transmitting places.

A functional constitution of the radiowave timepiece 130 will be explained in details as follows.

An antenna 132 receives the standard radiowave of the long wave of 40 kHz or 60 kHz. The standard radiowave of the long wave subjects time information referred to as time code to an AM modulation to a carrier wave of 40 kHz or 60 kHz. The received standard radiowave is amplified by an amplifier 133 and filtered and tuned by the filter portion 131 having a plurality of the piezoelectric vibrators 1.

The piezoelectric vibrator 1 according to the invention is respectively provided with quartz vibrator portions 138, 139 having resonance frequencies of 40 kHz and 60 kHz the same as the carrier frequencies.

Further, the filtered signal of the predetermined frequency is detected and decoded by a detecting and rectifying circuit 134. Successively, a time code is taken out by way of a waveform shaping circuit 135, and counted by CPU 136. CPU 136 reads information of current year, accumulated date, day of week, time or the like. The read information is reflected to RTC 137 and accurate time information is displayed.

The carrier wave is provided with 40 kHz or 60 kHz, and therefore, the vibrator having the structure of the tuning fork type is preferable for the quartz vibrator portions 138, 139.

Further, although the above-described explanation shows the example in Japan, the frequency of the standard radiowave of the long wave differs overseas. For example, in Germany, a standard radiowave of 77.5 kHz is used. Therefore, when the radiowave timepiece 130 capable of dealing with overseas is integrated to the portable apparatus, the piezoelectric vibrator 1 of a frequency which differs from that of the case of Japan is needed.

As described above, according to the radiowave timepiece 130 of the embodiment, the piezoelectric vibrator 1 brought into high quality formation and low cost formation is provided, and therefore, the radiowave timepiece per se can achieve high quality formation and low cost formation similarly. Further, in addition thereto, time can be counted highly accurately and stably over a long period of time.

Although the embodiment of the invention has been described in details in reference to the drawings as described above, a specific constitution is not limited to the embodiment but includes a design change or the like within the range not deviated from the gist of the invention. For example, although according to the oscillator, the portable telephone information apparatus and the radiowave timepiece mentioned above, as the piezoelectric vibrator, the piezoelectric vibrator 1 of the cylinder package type having the piezoelectric vibrating piece 2 of the tuning fork type is used, the invention is not limited thereto. As the piezoelectric vibrator, the thickness slipping vibrator 70, the piezoelectric vibrator 80 of the ceramic package type, the surface mounting type vibrator 90 or the like may be used.

What is claimed is:

1. A method of fabricating a plurality of piezoelectric vibrating pieces each having a piezoelectric plate, a pair of exciting electrodes formed on an outer surface of the piezoelectric plate for vibrating the piezoelectric plate when a predetermined drive voltage is applied thereto, and a pair of mount electrodes formed on a base end side of the piezoelectric plate and respectively electrically connected to the pair of exciting electrodes utilizing a wafer comprising a piezoelectric material, the method comprising:
   an outer shape forming step of forming a frame portion and forming the plurality of piezoelectric plates connected to the frame portion in a cantilever shape by a connecting portion in which base end sides of the piezoelectric plates are connected to the frame portion by etching the wafer using photolithography technology;
   an electrode forming step of patterning an electrode film on the wafer and respectively forming the pairs of exciting electrodes and the pairs of mount electrodes on the plurality of piezoelectric plates and forming a common electrode respectively electrically connected to the plurality of mount electrodes on a first side of the piezoelectric plates by leads on the connecting portion on the frame portion;
   a frequency adjusting step of adjusting a frequency of the piezoelectric plate while vibrating the piezoelectric plate by applying a drive voltage between the common electrode and the mount electrode on a second side of the piezoelectric plate; and
   a cutting step of fragmenting the plurality of piezoelectric plates by cutting the connecting portion and the leads and simultaneously completing formation of the mount electrodes on the first side of the piezoelectric plates.

2. The method of fabricating a piezoelectric vibrating piece according to claim 1, wherein the frequency of the piezoelectric plates is adjusted while vibrating the plurality of piezoelectric plates simultaneously by applying the drive voltage between the common electrode and the mount electrode on the second side in the frequency adjusting step.

3. The method of fabricating a piezoelectric vibrating piece according to claim 1 further comprising adjusting the frequency of the piezoelectric plates by applying a predetermined drive voltage to the exciting electrodes.

* * * * *